United States Patent
Li

(10) Patent No.: US 10,812,052 B2
(45) Date of Patent: Oct. 20, 2020

(54) PULSE CODE MODULATION PASSBAND FILTER AND METHOD FOR OBTAINING MULTIPLE FILTER PASSBANDS

(71) Applicant: Yui Hung Li, Kowloon (HK)

(72) Inventor: Yui Hung Li, Kowloon (HK)

(73) Assignee: Yui Hung Li, Kowloon (HK)

( * ) Notice: Subject to any disclaimer, the term of this patent is extended or adjusted under 35 U.S.C. 154(b) by 0 days.

(21) Appl. No.: 16/550,959

(22) Filed: Aug. 26, 2019

(65) Prior Publication Data
US 2020/0067493 A1 Feb. 27, 2020

(30) Foreign Application Priority Data
Aug. 27, 2018 (CN) .......................... 2018 1 0979758

(51) Int. Cl.
*H03H 17/02* (2006.01)
*H03H 17/06* (2006.01)
*H04L 25/49* (2006.01)

(52) U.S. Cl.
CPC .... *H03H 17/0283* (2013.01); *H03H 17/0621* (2013.01); *H04L 25/49* (2013.01); *H03H 2017/0298* (2013.01)

(58) Field of Classification Search
CPC .......... H03H 17/0283; H03H 17/0621; H03H 2017/0298; H03H 17/0266; H04L 25/49; H04L 25/4917
(Continued)

(56) References Cited

U.S. PATENT DOCUMENTS 4,674,125 A 6/1987 Carlson et al.
4,882,638 A 11/1989 Onishi et al.
(Continued)

FOREIGN PATENT DOCUMENTS

EP 0658979 6/1995
EP 1970902 9/2008
(Continued)

OTHER PUBLICATIONS

European Application No. 19192695.5, Partial European Search Report dated Jan. 24, 2020, 15 pages.
(Continued)

*Primary Examiner* — Fitwi Y Hailegiorgis
(74) *Attorney, Agent, or Firm* — Kilpatrick Townsend & Stockton LLP

(57) ABSTRACT

A 1st frequency reduction circuit of a filter of the invention downsamples the sampling rate of a signal source to a predetermined value to obtain a 1st PCM stream, a 1st frequency raising circuit raises the sampling rate of the 1st PCM stream to be the same as that of the signal source, a 1st delay circuit delays a stream of the signal source, such that its phase is the same as that of the 1st PCM stream, a 1st adder subtracts the frequency raised 1st PCM steam from the delayed stream of the signal source to obtain a passband 1, a j-th frequency reduction circuit downsamples the sampling rate of a (j−1)-th PCM stream to a predetermined value to obtain a j-th PCM stream, wherein 2≤j≤n, a j-th frequency raising circuit raises the sampling rate of the j-th PCM stream to be the same as that of the (j−1)-th PCM stream, a j-th delay circuit delays the (j−1)-th PCM stream, such that its phase is the same as that of the j-th PCM stream, a j-th adder subtracts the frequency raised j-th PCM stream from the delayed (j−1)-th PCM stream to obtain a passband j, and when j=n, the j-th PCM stream is a passband n+1.

13 Claims, 11 Drawing Sheets

(58) Field of Classification Search
USPC .................................. 375/254; 455/90.1, 334
See application file for complete search history.

(56) References Cited

U.S. PATENT DOCUMENTS

| | | |
|---|---|---|
| 5,719,571 A | 2/1998 | Akune et al. |
| 2004/0198240 A1* | 10/2004 | Oliveira .................. H04M 1/03 |
| | | 455/90.1 |
| 2006/0111074 A1* | 5/2006 | Petilli ...................... H04B 1/28 |
| | | 455/334 |
| 2008/0159551 A1 | 7/2008 | Harley et al. |

FOREIGN PATENT DOCUMENTS

| | | |
|---|---|---|
| EP | 2200180 | 6/2010 |
| JP | 2001195091 | 7/2001 |
| WO | 2017053447 | 3/2017 |

OTHER PUBLICATIONS

Fliege et al., Multi-Complementary Filter Bank, IEEE International Conference on Acoustics Speech and Signal Processing, vol. 3, Apr. 27, 1993, pp. 193-196.
International Application No. PCT/CN2019/102663, International Search Report and Written Opinion dated Nov. 7, 2019, 9 pages.
Takahashi et al., Multi-Scale Multi-Band DenseNets for Audio Source Separation, IEEE Workshop on Applications of Signal Processing to Audio and Acoustics, Oct. 18, 2017, pp. 21-25.
European Application No. 19192695.5, Extended European Search Report referenced in Jun. 3, 2020, 17 pages.

\* cited by examiner

PULSE CODE MODULATION PASSBAND FILTER AND METHOD FOR OBTAINING MULTIPLE FILTER PASSBANDS

CROSS-REFERENCE TO RELATED APPLICATIONS

This application claims priority to Chinese Patent Application No. 201810979758.2, filed Aug. 27, 2018, which is incorporated by reference herein in its entirety.

TECHNICAL FIELD

The invention relates to a filter and a method for obtaining a filter passband, and in particular, to a pulse code modulation (PCM) passband filter and a method for obtaining multiple filter passbands.

BACKGROUND

The pursuit of high fidelity in music is endless. Earlier high-fidelity listening pursuers have divided the audio band into multiple bands, respectively controlled their gains and built an equalizer. However, the bands into which the audio band is divided are as many as the passband filters that are needed, and earlier passband filters were constructed by passive parts, phase shift distortion thereof is large and their maintenance is difficult.

After the emergence of digital music, engineers use DSPs for FIR calculations, construct a digital passband filter, and solve the problems of phase shift distortion and maintenance. However, the operation speed of a DSP cannot effectively frequency divide an audio pulse code modulation (PCM) stream of 24 bit/192 Kfs and higher flow.

SUMMARY

This invention is proposed to solve the above problems, and its purpose is to provide a pulse code modulation passband filter, which may divide pulse code modulation of the whole audio range (20 Hz~20 kHz) into multiple bands to be taken out and constitute a multi-channel digital passband filter.

The pulse code modulation passband filter of the invention comprises a 1st to an n-th delay circuits, a 1st to an n-th frequency reduction circuits, a 1st to an n-th frequency raising circuits and a 1st to an n-th adders, n is an integer greater than or equal to 1, the 1st frequency reduction circuit downsamples the sampling rate of a pulse code modulation stream from a pulse code modulation signal source to a predetermined sampling rate and thereby obtains a 1st pulse code modulation stream, the 1st frequency raising circuit raises the sampling rate of the 1st pulse code modulation stream to be the same as that of the pulse code modulation stream from the pulse code modulation signal source, the 1st delay circuit delays the pulse code modulation stream from the pulse code modulation signal source, such that its phase is the same as that of the 1st pulse code modulation stream after the delay, the 1st adder subtracts an output of the 1st frequency raising circuit from the delayed pulse code modulation stream from the pulse code modulation signal source to obtain a 1st passband, the j-th frequency reduction circuit downsamples the sampling rate of a pulse code modulation stream from a (j−1)-th frequency reduction circuit (i.e., a (j−1)-th pulse code modulation stream) to a predetermined sampling rate and thereby obtains a j-th pulse code modulation stream, wherein 2≤j≤n, the j-th frequency raising circuit raises the sampling rate of the j-th pulse code modulation stream to be the same as that of the pulse code modulation stream from the (j−1)-th frequency reduction circuit (i.e., the (j−1)-th pulse code modulation stream), the j-th delay circuit delays the pulse code modulation stream from the (j−1)-th frequency reduction circuit (i.e., the (j−1)-th pulse code modulation stream), such that its phase is the same as that of the j-th pulse code modulation stream after the delay, the j-th adder subtracts an output of the j-th frequency raising circuit (i.e., the j-th pulse code modulation stream) from the delayed pulse code modulation stream of the (j−1)-th frequency reduction circuit (i.e., the (j−1)-th pulse code modulation stream) to obtain a j-th passband, and when j=n, the output of the j-th frequency raising circuit is a (n+1)-th passband.

According to the above scheme of the invention, n+1 filter passbands may be obtained.

In addition, in the pulse code modulation passband filter of the invention, there further have a 1st to an n-th passband frequency raising circuits arranged corresponding to the 2nd to the (n+1)-th passbands, respectively, which upsample the 2nd to the (n+1)-th passbands to be the same as the sampling rate of the pulse code modulation stream of the pulse code modulation signal source, respectively.

In addition, in the pulse code modulation passband filter of the invention, there further have a 1st to an n-th passband delay circuits arranged corresponding to the 1st to the n-th passbands, respectively, which thus cause the phases of the 1st to the (n+1)-th passbands to be consistent. As such, a many-way crossover with n+1 passbands is actually constructed.

In addition, in the pulse code modulation passband filter of the invention, there further have m passband adding circuits which group and add adjacent passbands of the 1st to the (n+1)-th passbands, wherein 1<m<n+1. As such, a few-way crossover with m passbands is actually constructed.

In addition, in the pulse code modulation passband filter of the invention, there further have a 1st to a (n+1)-th digital gain control circuits arranged corresponding to the 1st to the (n+1)-th passbands, respectively, and there further comprises a circuit which adds the outputs of the 1st to the (n+1)-th digital gain control circuits. As such, an equalizer which adds the n+1 passbands is actually constructed.

In addition, the invention provides a method for obtaining multiple filter passbands including the following steps:

downsampling the sampling rate of a pulse code modulation stream from a pulse code modulation signal source to a predetermined sampling rate and thereby obtaining a 1st pulse code modulation stream;

raising the sampling rate of the 1st pulse code modulation stream to be the same as that of the pulse code modulation stream from the pulse code modulation signal source;

delaying the pulse code modulation stream from the pulse code modulation signal source, such that its phase is the same as that of the 1st pulse code modulation stream after the delay;

subtracting the frequency raised 1st pulse code modulation stream from the delayed pulse code modulation stream from the pulse code modulation signal source to obtain a 1st passband;

downsampling the sampling rate of a (j−1)-th pulse code modulation stream to a predetermined sampling rate and thereby obtaining a j-th pulse code modulation stream, wherein 2≤j≤n, and n is the number of times that the pulse code modulation signal source is frequency reduced;

raising the sampling rate of the j-th pulse code modulation stream to be the same as that of the (j−1)-th pulse code modulation stream;

delaying the (j−1)-th pulse code modulation stream, such that its phase is the same as that of the j-th pulse code modulation stream after the delay; and subtracting the frequency raised j-th pulse code modulation stream from the delayed (j−1)-th pulse code modulation stream to obtain a j-th passband, wherein when j=n, the j-th pulse code modulation stream is a (n+1)-th passband.

In addition, the invention provides a pulse code modulation passband filter, characterized in that, it comprises:

an audio pulse code modulation signal source outputting an audio pulse code modulation stream;

a frequency raising & reduction circuit performing frequency raising or reduction on the sampling rate of the audio pulse code modulation stream from the audio pulse code modulation signal source and converting it into a preset sampling rate, namely, a working sampling rate;

a main clock generation circuit extracting from the audio pulse code modulation signal source a main clock which is synchronized with the audio pulse code modulation signal source and corresponds to an output of the frequency raising & reduction circuit;

a 1st to an n-th frequency dividers performing frequency reduction by greater than 1 and less than 2 times on the main clock respectively to obtain a 1st to an n-th clocks which are different; and a 1st to an n-th secondary signal sources performing frequency reduction on the working sampling rate of a stream outputted from the frequency raising & reduction circuit according to the 1st to the n-th clocks respectively and outputting a 1st to an n-th secondary streams respectively, and the stream outputted by the frequency raising & reduction circuit and the 1st to the n-th secondary streams are used as a combined input source of the pulse code modulation passband filter.

In addition, in the pulse code modulation passband filter of the invention, the sampling rate of the audio pulse code modulation signal source is any of 32 kfs~768 kfs.

In addition, in the pulse code modulation passband filter of the invention, the sampling rate of the stream outputted by the frequency raising & reduction circuit is 192 kfs.

In addition, the invention provides a pulse code modulation passband filter, characterized in that, it comprises: a pulse code modulation signal source, a 1st to an n-th delay circuits, a 1st to an n-th frequency reduction circuits, a 1st to an n-th frequency raising circuits and a 1st to an n-th adders, and n is an integer greater than or equal to 1, the pulse code modulation passband filter further comprises a 2-fold frequency reduction circuit and a 2-fold frequency raising circuit, the 2-fold frequency reduction circuit performs 2-fold frequency reduction on the sampling rate of a pulse code modulation stream from the pulse code modulation signal source, and the 2-fold frequency raising circuit performs 2-fold frequency raising on an output of the 2-fold frequency reduction circuit, such that the sampling rate of a stream outputted by the 2-fold frequency raising circuit is raised to be the same as that of the pulse code modulation stream from the pulse code modulation signal source, the 1st frequency reduction circuit performs greater than 1-fold and less than 2-fold frequency reduction on the sampling rate of the pulse code modulation stream from the pulse code modulation signal source, thereby obtaining a 1st pulse code modulation stream, the 1st frequency raising circuit raises the sampling rate of the 1st pulse code modulation stream to be the same as that of the pulse code modulation stream from the pulse code modulation signal source, the 1st delay circuit delays the pulse code modulation stream from the pulse code modulation signal source, such that its phase is the same as that of the 1st pulse code modulation stream after the delay, the 1st adder subtracts an output of the 1st frequency raising circuit from the delayed pulse code modulation stream from the pulse code modulation signal source to obtain a 1st passband, the j-th frequency reduction circuit performs greater than 1-fold and less than 2-fold frequency reduction on the sampling rate of the pulse code modulation stream from the pulse code modulation signal source, thereby obtaining a j-th pulse code modulation stream, wherein 2≤j≤n, the j-th frequency raising circuit raises the sampling rate of the j-th pulse code modulation stream to be the same as that of a (j−1)-th pulse code modulation stream, the j-th delay circuit delays a pulse code modulation stream from the (j−1)-th frequency raising circuit, such that its phase is the same as that of the j-th pulse code modulation stream after the delay, the j-th adder subtracts an output of the j-th frequency raising circuit from the delayed pulse code modulation stream of the (j−1)-th frequency reduction circuit to obtain a j-th passband, the pulse code modulation passband filter further comprises a (n+1)-th delay circuit and a (n+1)-th adder, when j=n, the (n+1)-th delay circuit is utilized to delay a pulse code modulation stream from the n-th frequency raising circuit, such that its phase is the same as that of the stream outputted by the 2-fold frequency raising circuit after the delay, and the (n+1)-th adder subtracts the stream outputted by the 2-fold frequency raising circuit from the delayed pulse code modulation stream of the n-th frequency raising circuit to obtain a (n+1)-th passband.

In addition, in the pulse code modulation passband filter of the invention, there further have a 1st to a (n+1)-th digital gain control circuits arranged corresponding to the 1st to the (n+1)-th passbands, respectively, which can be utilized to adjust gains of the 1st to the (n+1)-th passbands, respectively. Hence, tuning of the output of the pulse code modulation passband filter can be implemented.

In addition, the invention provides a method for obtaining multiple filter passbands including the following steps:

performing greater than 1-fold and less than 2-fold frequency reduction on the sampling rate of a pulse code modulation stream from a pulse code modulation signal source, thereby obtaining a 1st pulse code modulation stream, raising the sampling rate of the 1st pulse code modulation stream to be the same as that of the pulse code modulation stream from the pulse code modulation signal source, delaying the pulse code modulation stream from the pulse code modulation signal source, such that its phase is the same as that of the 1st pulse code modulation stream after the delay, subtracting the frequency raised 1st pulse code modulation stream from the delayed pulse code modulation stream from the pulse code modulation signal source to obtain a 1st passband, performing greater than 1-fold and less than 2-fold frequency reduction on the sampling rate of the pulse code modulation stream from the pulse code modulation signal source, thereby obtaining a j-th pulse code modulation stream, wherein 2≤j≤n, and n is the number of input points inserted between the pulse code modulation signal source and an input point obtained by performing 2-fold frequency reduction on the sampling rate of the signal source, raising the sampling rate of the j-th pulse code modulation stream to be the same as that of a (j−1)-th pulse code modulation stream, delaying the (j−1)-th pulse code modulation stream, such that its phase is the same as that of the j-th pulse code modulation stream after the delay, subtracting the frequency raised j-th pulse code modulation stream from the delayed (j−1)-th pulse code modulation stream to obtain a j-th passband, when j=n, delaying an n-th pulse code modulation stream, such that after the delay, its phase is the same as that of a 2-fold frequency reduced stream obtained after 2-fold frequency reduction is performed on the sampling rate of the pulse code modulation stream from the pulse code modulation signal source, and subtracting a stream after 2-fold frequency raising is performed on the 2-fold frequency reduced stream from the delayed n-th pulse code modulation stream to obtain a (n+1)-th passband.

In addition, in the above method of the invention, gains of the 1st to the (n+1)-th passbands are adjusted respectively, and outputs of the individual passbands are added after the gain adjustment. Hence, tuning of the output of the pulse code modulation passband filter can be implemented, and after the addition, they may act as an output terminal for output.

According to the invention, by compressing and increasing the sampling rate for an audio pulse code modulation (PCM) stream, utilizing a delay circuit and logic addition/subtraction and taking out a pulse code of a certain audio band in the audio pulse code modulation stream, this is equivalent to a digital passband filter. The invention can divide the pulse code modulation of the whole audio range (20 Hz~20 kHz) into multiple bands and take them out, and constitute a multi-channel digital passband filter.

The effective working range of the invention for the sampling rate may achieve 768 Kfs, and the effective working range for the audio is 20 Hz~40 kHz.

BRIEF DESCRIPTION OF THE DRAWINGS

FIG. 2-1 to FIG. 2-10 are schematic diagrams of a multiple passband filter circuit for an audio PCM stream utilizing the invention.

DETAILED DESCRIPTION

In the following, implementations of the invention will be described with reference to the drawings.

First, the working principles of the invention will be described.

(1) With respect to a low-pass filter channel, the sampling rate of a PCM stream fs0 is downsampled to 2fs1, this downsampled PCM stream 2fs1 is just a digital low-pass filter channel of f1, its high-frequency cutoff frequency is f1 (Nyquist Theory), and likewise, it may be possible to construct n downsampled PCM streams 2fs2, 2fs3, 2fs4, . . . , 2fsn, and it holds that fs0>2fs1>2fs2>2fs3>2fs4> . . . >2fsn.

(2) With respect to a high-pass filter channel, fs0 is delayed, 2fs1 is upsampled to the sampling rate of fs0, a binary adder is used to subtract 2fs1 from fs0 to obtain a new PCM stream fs01 (namely, fs0-2fs1), this new PCM stream fs01 is a digital high-pass filter channel, and its low-frequency cutoff frequency is f1.

(3) With respect to a passband filter channel, 2fs2 is subtracted from 2fs1 using the approach in (2) to obtain a new PCM stream fs12 (namely, 2fs1-2fs2), this new PCM stream fs12 is a digital passband filter channel, its high-frequency cutoff frequency is f1, and its low-frequency cutoff frequency is f2. Likewise, 2fs3 is subtracted from 2fs2 to obtain a new PCM stream fs23 (namely, 2fs2-2fs3), this new PCM stream fs23 is also a digital passband filter channel, its high-frequency cutoff frequency is f2, and its low-frequency cutoff frequency is f3. Of course, it may also be possible to subtract 2fs4 from 2fs3 to obtain a new PCM stream fs34, . . . , and so on.

(4) With respect to a low passband filter channel, if downsampling stops after arriving at 2fs3, then 2fs3 is a low passband filter channel, and its high-frequency cutoff frequency is f3.

By the above operations, that is, if downsampling stops after arriving at 2fs3, then totally 4 digital filter passbands are constructed as shown in the following:

(I) a digital high-pass filter passband with a low-frequency cutoff frequency of f1;

(II) a digital filter passband of a higher frequency band with a high-frequency cutoff frequency of f1 and a low-frequency cutoff frequency of f2;

(III) a digital filter passband of a lower frequency band with a high-frequency cutoff frequency of f2 and a low-frequency cutoff frequency of f3; and (IV) a digital low-pass filter passband with a high-frequency cutoff frequency of f3.

Figure 1:
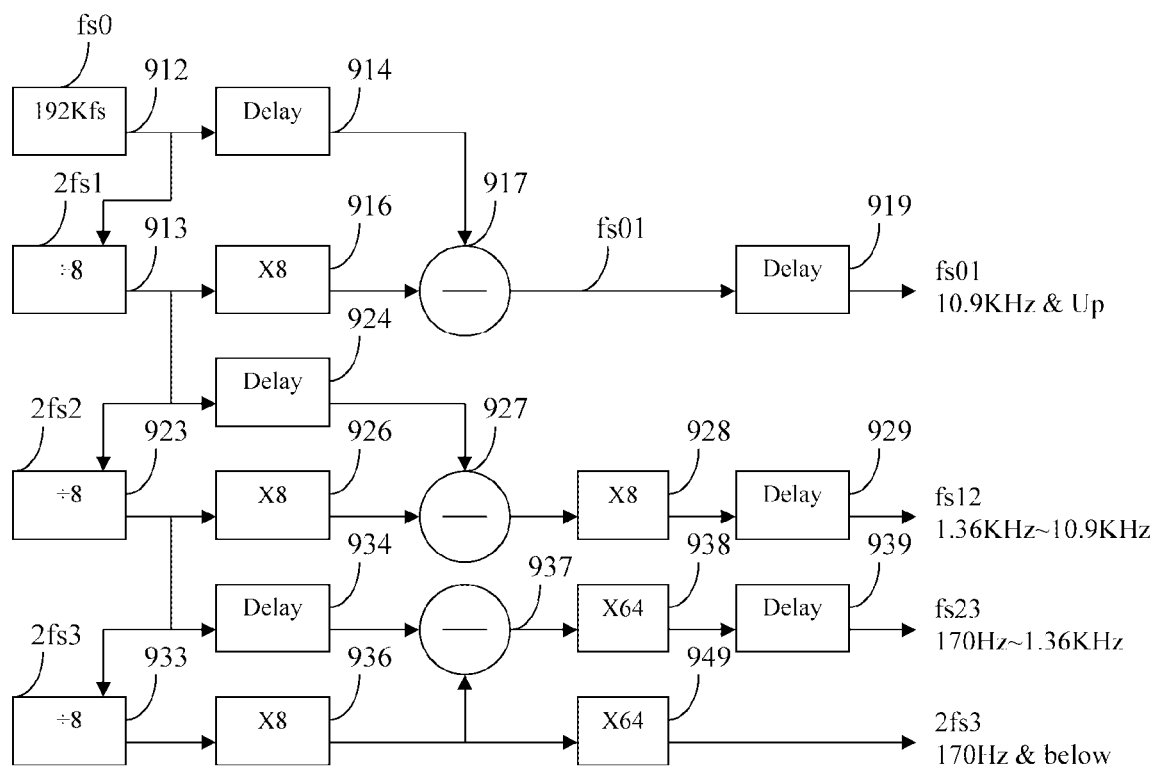
FIG. 1 is a schematic diagram of a 4-way crossover utilizing the invention.

The invention is obtained based on the above concept. As an example of applying the invention, FIG. 1 shows a schematic diagram of a 4-way crossover utilizing the idea of the invention. As shown in FIG. 1, a node 912 is an audio PCM signal source, namely, fs0, and its input is 192 kfs (sampling rate). A node 913 is an 8-fold frequency reduction circuit for applying 8-fold frequency reduction (÷8) to a signal from the node 912, and what is outputted from the node 913 is a PCM stream 2fs1. A node 916 is an 8-fold frequency raising circuit for applying 8-fold frequency raising (×8) to a signal from the node 913. A node 914 is a delay circuit for delaying the signal from the node 912, to cause the output delay of the node 914 to be equal to that of the node 916, that is, cause the phases of the two to be the same for facilitating a subsequent operation. A node 917 is a binary adder, which subtracts an output from the node 916 from an output from the node 914 to obtain a high-pass filter passband with a low-frequency cutoff frequency of 10.9 KHz. Here, the low-frequency cutoff frequency of 10.9 KHz is obtained according to the Nyquist Theory, that is, 8-fold frequency reduction is performed on the sampling rate 192 kfs to obtain a stream with a sampling rate of 24 kfs, the low-frequency cutoff frequency of 10.9 KHz is obtained utilizing 24 kfs×0.4535, and the working frequency of an individual passband will be obtained according to such an approach later. Here, what is outputted by the node 917 is a PCM stream fs01. A node 919 is a delay circuit for delaying a signal from the node 917. A node 923 is an 8-fold frequency reduction circuit for applying 8-fold frequency reduction (÷8) to the signal from the node 913, and what is outputted from the node 923 is a PCM stream 2fs2. A node 926 is an 8-fold frequency raising circuit for applying 8-fold frequency raising (×8) to a signal from the node 923. A node 924 is a delay circuit for delaying the signal from the node 913, to cause the output delay of the node 924 to be equal to that of the node 926, that is, cause the phases of the two to be the same, and functions of subsequent individual delay circuits are the same as the delay circuit. A node 927 is a binary adder, which subtracts an output from the node 926 from an output from the node 924 to obtain a passband filter passband with a high-frequency cutoff frequency of 10.9 KHz and a low-frequency cutoff frequency of 1.36 KHz. A node 928 is an 8-fold frequency raising circuit for applying 8-fold frequency raising (×8) to an output of the node 927. A node 929 is a delay circuit for delaying a signal from the node 928, and what is outputted from the node 929 is a PCM stream fs12. A node 933 is an 8-fold frequency reduction circuit for applying 8-fold frequency reduction to the signal from the node 923, and what is outputted from the node 933 is a PCM stream 2fs3. A node 936 is an 8-fold frequency raising circuit for applying 8-fold frequency raising (×8) to a signal from the node 933. A node 934 is a delay circuit for delaying the signal from the node 923, to cause the output delay of the node 934 to be equal to that of the node 936. A node 937 is a binary adder, which subtracts an output from the node 936 from an output from the node 934 to obtain a passband filter passband with a high-frequency cutoff frequency of 1.36 KHz and a low-frequency cutoff frequency of 170 Hz. A node 938 is a 64-fold frequency raising circuit for applying 64-fold frequency raising (×64) to an output of the node 937. A node 939 is a delay circuit for delaying a signal from the node 938, and what is outputted from the node 939 is a PCM stream fs23. A node 949 is a 64-fold frequency raising circuit for applying 64-fold frequency raising (×64) to a signal from the node 936, and this is a low-pass filter passband with a high-frequency cutoff frequency of 170 Hz, that is, what is outputted from the node 949 is a PCM stream 2fs3. In addition, since in the above circuitry there are delay circuits 919, 929, 939, when the 4-way crossover is in operation, the phases of the outputs of the above four passbands can be made equal, and it may further be possible to add the outputs of the four ways to constitute an equalizer.

The 4-way crossover is obtained as described above, and its audio frequencies are as follows: a high-pass filter passband with a low-frequency cutoff frequency of 10.9 KHz; a passband filter passband with a high-frequency cutoff frequency of 10.9 KHz and a low-frequency cutoff frequency of 1.36 KHz; a passband filter passband with a high-frequency cutoff frequency of 1.36 KHz and a low-frequency cutoff frequency of 170 Hz; and a low-pass filter passband with a high-frequency cutoff frequency of 170 Hz.

In addition, in FIG. 1, as an example, it is shown that the sampling rate of the signal source is 192 kfs; however, the sampling rate is not limited thereto, and other sampling rates may also be set according to the needs. Additionally, the frequency reduction circuits and the frequency raising circuits in FIG. 1 are not necessarily limited to 8-fold frequency reduction and frequency raising, and it may also be possible to set other folds (e.g., 2-fold frequency) according to the needs. In addition, what is finally obtained in FIG. 1 is a 4-way crossover, however, it may also be possible to increase the number of stages similarly as described above as required. For example, in the circuitry, it may be possible to have n adders and n delay circuits, n frequency reduction circuits, n frequency raising circuits corresponding to them respectively, n being an integer greater than or equal to 1, and connect the delay circuits, the frequency reduction circuits, the frequency raising circuits and the adders in a manner as shown in FIG. 1 (wherein the frequency reduction multiple of a frequency reduction circuit and the frequency raising multiple of a frequency raising circuit may be set as required, for example, 2-fold, which are not limited to 8-fold), thereby constructing more passband filters.

Figures 1, 2:
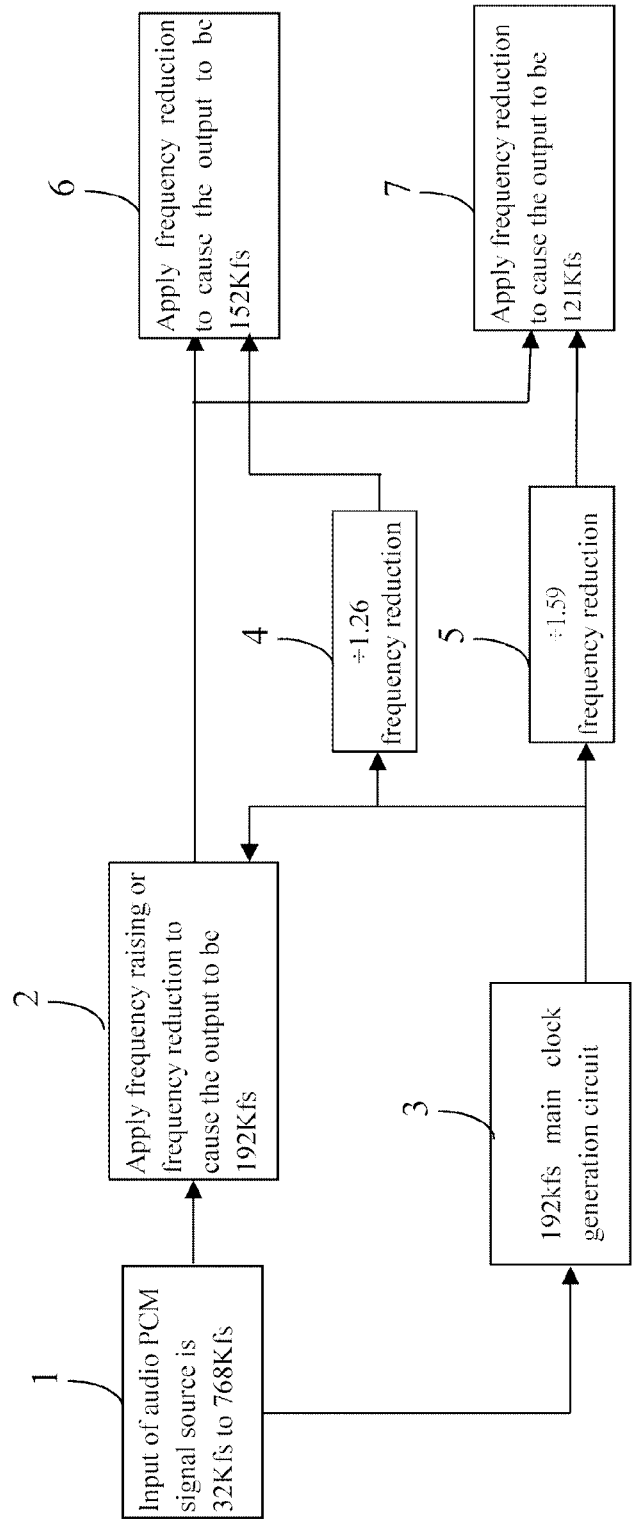
Figure 2:
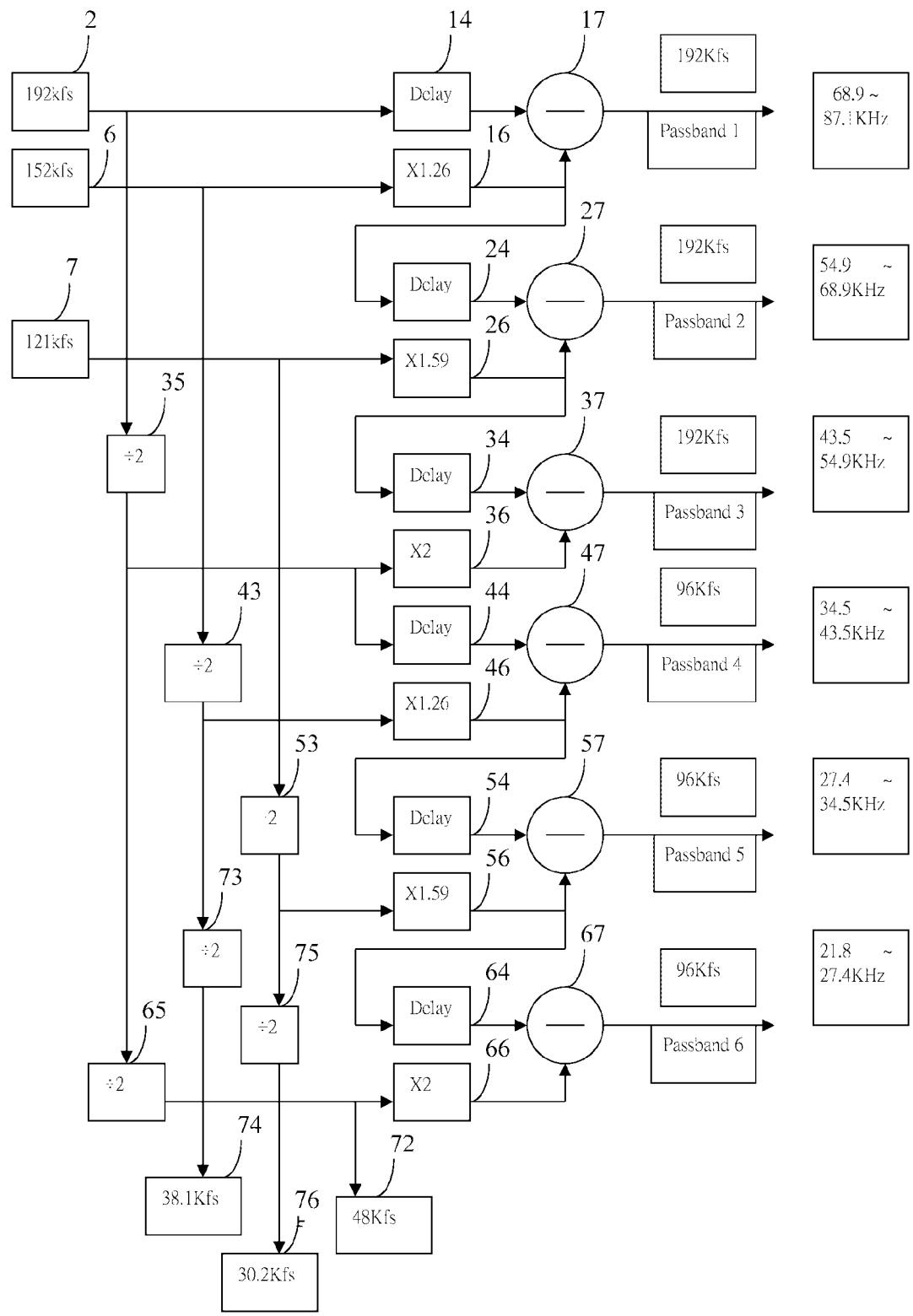

In addition, FIG. 2-1 to FIG. 2-10 are schematic diagrams of a multiple passband filter circuit for an audio PCM stream utilizing the idea of the invention. As shown in FIG. 2-1, an input of an audio PCM signal source at a node 1 is 32 kfs~768 kfs (sampling rate), frequency raising or frequency reduction is applied to the audio PCM signal source at a node 2 to cause its output to be a preset sampling rate, i.e., a working sampling rate, and the preset sampling rate may be any of 32 kfs~768 kfs, which is shown to be 192 kfs as an example in FIG. 2-1, that is, the node 2 is a frequency raising or reduction circuit. In addition, a main clock (of which the frequency is 64 times the sampling rate or higher) synchronized with the audio PCM signal source and corresponding to 192 kfs is extracted from the audio PCM signal source at a node 3, 1.26-fold frequency reduction is performed by a frequency divider on the main clock to obtain a 1st clock at a node 4, and 1.59-fold frequency reduction is performed by a frequency divider on the main clock to obtain a 2nd clock at a node 5. The 1st clock and an output from the node 2 are inputted to a node 6, and as a result, what is outputted from the node 6 is a PCM stream with a sampling rate of 152 kfs which is obtained by downsampling a stream with a sampling rate of 192 kfs. Likewise, The 2nd clock and the output from the node 2 are inputted to a node 7, and as a result, what is outputted from the node 7 is a PCM stream with a sampling rate of 121 kfs which is obtained by downsampling the stream with the sampling rate of 192 kfs. In FIG. 2-1, the nodes 2, 6, 7 are a combined input point of the multiple passband filter circuit, the nodes 4, 5 are frequency divider nodes used to adjust the band distance and the number of bands, the number of frequency dividers will not be particularly defined, and the frequency reduction multiples of the individual frequency dividers are all between 1 and 2 (namely, 1<frequency reduction multiple of a frequency divider<2), that is, although only two frequency dividers are shown in FIG. 2-1, the number is not limited thereto, and the number of frequency dividers may be set as needed, moreover, the frequency reduction multiple is also not limited to the numerical values as shown in FIG. 2-1, as long as it is greater than 1 and less than 2.

That is to say, in order to be able to perform finer tuning (namely, increasing the number of passbands and adjusting gains of outputs of the individual passbands as required) on the crossover (or the equalizer), for example, according to the needs, between the node 2 as a primary signal source and one signal input point in multiple input points after 2-fold frequency reduction is performed on its sampling rate, a predetermined number of input points are inserted for which greater than 1-fold and less than 2-fold frequency reduction is performed on the sampling rate of the signal source (for example, the nodes 6, 7 in FIG. 2-1 and FIG. 2-2, the frequency reduction multiple is different at each input node), and thereby more passbands (e.g., passbands 1~3 in FIG. 2-2) can be obtained to perform finer tuning. In addition, likewise, multiple input points may also be inserted as described above between an input point at which the sampling rate of the signal source is 2-fold frequency reduced and an input point obtained by further performing 2-fold frequency reduction on the sampling rate of the input point, and so on, until the design needs are satisfied.

In addition, FIG. 2-2 is a continuous drawing of FIG. 2-1. Actually, in FIG. 2-2, the node 2 may be considered as a PCM signal source with a sampling rate of 192 kfs, a node 35 may be considered as an input point (i.e., the sampling rate is 96 kfs) at which 2-fold frequency reduction (÷2) is performed on the sampling rate of the PCM signal source, and although not shown, the nodes 6, 7 may be regarded as additional two input points inserted between the node 2 and the node 35, that is, a stream (the sampling rate is 152 kfs) of the node 6 is obtained by performing 1.26-fold frequency reduction on a stream with a sampling rate of 192 kfs of the node 2 by a frequency reduction circuit, and a stream (the sampling rate is 121 kfs) of the node 7 is obtained by performing 1.59-fold frequency reduction on a stream with a sampling rate of 192 kfs of the node 2 by a frequency reduction circuit. At this point, two input points are inserted between a signal source and an input point obtained by performing 2-fold frequency reduction on its sampling rate, however, this is not limited, and it may be possible to insert n input points between them as described above according to the needs, n being an integer greater than or equal to 1. In addition, likewise, in FIG. 2-2, it may also be regarded that additional two input nodes 43, 53 are inserted between the node 35 and a node 65, and the same is true in FIG. 2-3 to FIG. 2-7, that is, practically, by performing frequency reduction on the sampling rate of a stream in a cyclic manner to obtain corresponding passbands, a pulse code modulation passband filter that meets the design needs is thus obtained. In an example of this application, 37 filter passbands are obtained.

In particular, as shown in FIG. 2-2, 1.26-fold frequency raising (×1.26) is applied to an output of the node 6 to obtain a PCM stream of 192 kfs at a node 16, a node 14 is a delay circuit and applies a delay to an output of the node 2 to cause the output delay of the node 14 to be equal to that of the node 16, an output of the node 16 is subtracted from an output of the node 14 at a node 17, thereby obtaining a filter passband with a low-frequency cutoff frequency of 68.9 KHz and a high-frequency cutoff frequency of 87.1 KHz, and this is a filter passband 1. 1.59-fold frequency raising (×1.59) is applied to an output of the node 7 to obtain a PCM stream of 192 kfs at a node 26, a node 24 is a delay circuit and applies a delay to the output of the node 16 to cause the output delay of the node 24 to be equal to that of the node 26, an output of the node 26 is subtracted from an output of the node 24 at a node 27, thereby obtaining a filter passband with a low-frequency cutoff frequency of 54.9 KHz and a high-frequency cutoff frequency of 68.9 KHz, and this is a filter passband 2. 2-fold frequency reduction (÷2) is applied to the output of the node 2 at the node 35, 2-fold frequency raising (×2) is applied to an output of the node 35 to obtain a PCM stream of 192 kfs at a node 36, a node 34 is a delay circuit and applies a delay to the output of the node 26 to cause the output delay of the node 34 to be equal to that of the node 36, an output of the node 36 is subtracted from an output of the node 34 at a node 37, thereby obtaining a filter passband with a low-frequency cutoff frequency of 43.5 KHz and a high-frequency cutoff frequency of 54.9 KHz, and this is a filter passband 3. 2-fold frequency reduction (÷2) is applied to the output of the node 6 at the node 43, 1.26-fold frequency raising (×1.26) is applied to an output of the node 43 to obtain a PCM stream of 96 kfs at a node 46, a node 44 is a delay circuit and applies a delay to the output of the node 35 to cause the output delay of the node 44 to be equal to that of the node 46, an output of the node 46 is subtracted from an output of the node 44 at a node 47, thereby obtaining a filter passband with a low-frequency cutoff frequency of 34.5 KHz and a high-frequency cutoff frequency of 43.5 KHz, and this is a filter passband 4. 2-fold frequency reduction (÷2) is applied to the output of the node 7 at the node 53, 1.59-fold frequency raising (×1.59) is applied to an output of the node 53 to obtain a PCM stream of 96 kfs at a node 56, a node 54 is a delay circuit and applies a delay to the output of the node 46 to cause the output delay of the node 54 to be equal to that of the node 56, an output of the node 56 is subtracted from an output of the node 54 at a node 57, thereby obtaining a filter passband with a low-frequency cutoff frequency of 27.4 KHz and a high-frequency cutoff frequency of 34.5 KHz, and this is a filter passband 5. 2-fold frequency reduction (÷2) is applied to the output of the node 35 at the node 65, 2-fold frequency raising (×2) is applied to an output of the node 65 to obtain a PCM stream of 96 kfs at a node 66, a node 64 is a delay circuit and applies a delay to the output of the node 56 to cause the output delay of the node 64 to be equal to that of the node 66, an output of the node 66 is subtracted from an output of the node 64 at a node 67, thereby obtaining a filter passband with a low-frequency cutoff frequency of 21.8 KHz and a high-frequency cutoff frequency of 27.4 KHz, and this is a filter passband 6.

The filter passbands 1~6 obtained in FIG. 2-2 go beyond the human audible range, and therefore will not be used for constructing an equalizer.

In addition, 2-fold frequency reduction (÷2) is applied to the output of the node 43 at a node 73, and 2-fold frequency reduction (÷2) is applied to the output of the node 53 at a node 75.

Figures 2, 3:
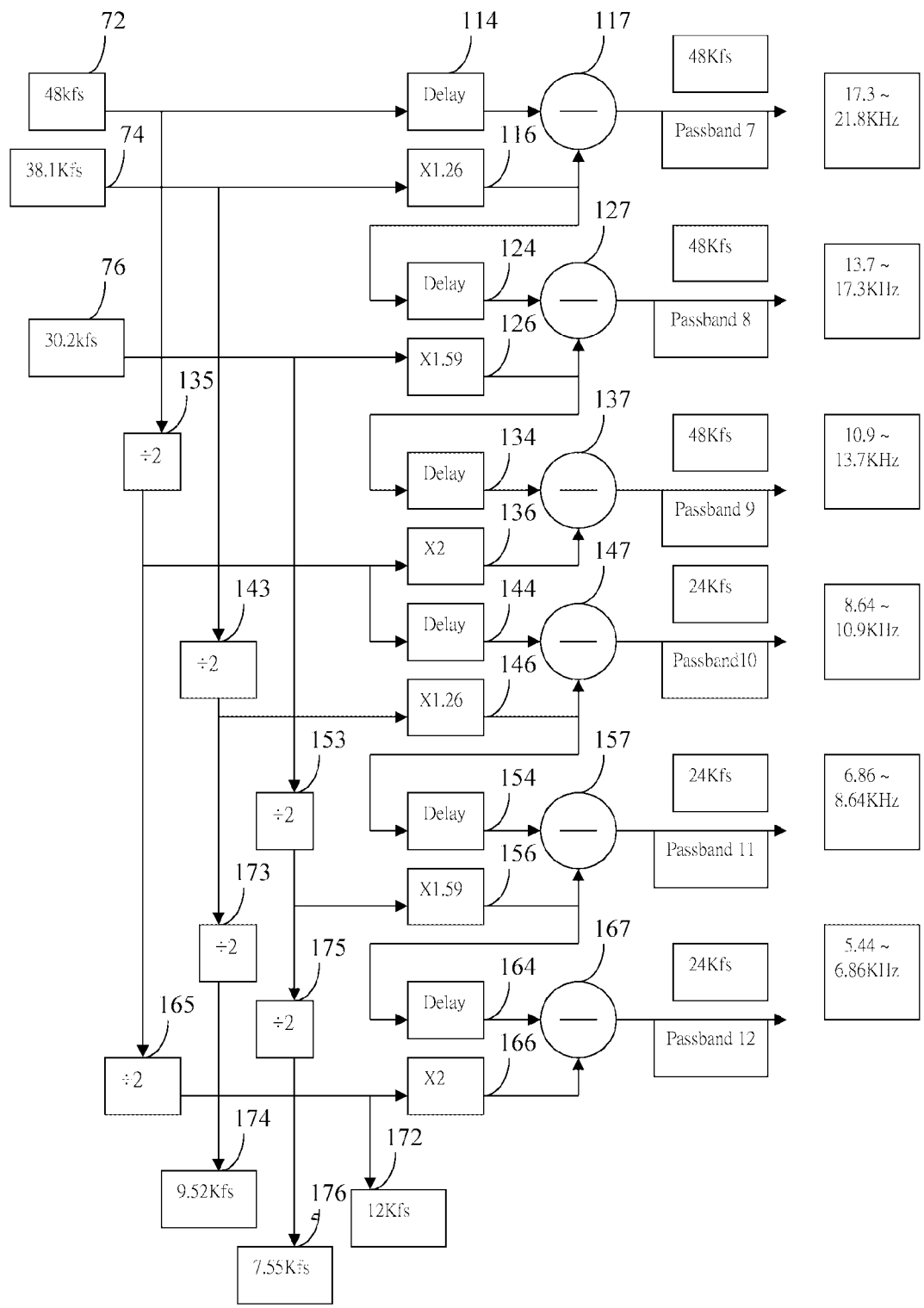

In addition, FIG. 2-3 is a continuous drawing of FIG. 2-2. As shown in FIG. 2-3, 1.26-fold frequency raising (×1.26) is applied to an output of a node 74 to obtain a PCM stream of 48 kfs at a node 116, a node 114 is a delay circuit and applies a delay to an output of a node 72 to cause the output delay of the node 114 to be equal to that of the node 116, an output of the node 116 is subtracted from an output of the node 114 at a node 117, thereby obtaining a filter passband with a low-frequency cutoff frequency of 17.3 KHz and a high-frequency cutoff frequency of 21.8 KHz, and this is a filter passband 7. 1.59-fold frequency raising (×1.59) is applied to an output of a node 76 to obtain a PCM stream of 48 kfs at a node 126, a node 124 is a delay circuit and applies a delay to the output of the node 116 to cause the output delay of the node 124 to be equal to that of the node 126, an output of the node 126 is subtracted from an output of the node 124 at a node 127, thereby obtaining a filter passband with a low-frequency cutoff frequency of 13.7 KHz and a high-frequency cutoff frequency of 17.3 KHz, and this is a filter passband 8. 2-fold frequency reduction (÷2) is applied to the output of the node 72 at a node 135, 2-fold frequency raising (×2) is applied to an output of the node 135 to obtain a PCM stream of 48 kfs at a node 136, a node 134 is a delay circuit and applies a delay to the output of the node 126 to cause the output delay of the node 134 to be equal to that of the node 136, an output of the node 136 is subtracted from an output of the node 134 at a node 137, thereby obtaining a filter passband with a low-frequency cutoff frequency of 10.9 KHz and a high-frequency cutoff frequency of 13.7 KHz, and this is a filter passband 9. 2-fold frequency reduction (÷2) is applied to the output of the node 74 at a node 143, 1.26-fold frequency raising (×1.26) is applied to an output of the node 143 to obtain a PCM stream of 24 kfs at a node 146, a node 144 is a delay circuit and applies a delay to the output of the node 135 to cause the output delay of the node 144 to be equal to that of the node 146, an output of the node 146 is subtracted from an output of the node 144 at a node 147, thereby obtaining a filter passband with a low-frequency cutoff frequency of 8.64 KHz and a high-frequency cutoff frequency of 10.9 KHz, and this is a filter passband 10. 2-fold frequency reduction (÷2) is applied to the output of the node 76 at a node 153, 1.59-fold frequency raising (×1.59) is applied to an output of the node 153 to obtain a PCM stream of 24 kfs at a node 156, a node 154 is a delay circuit and applies a delay to the output of the node 146 to cause the output delay of the node 154 to be equal to that of the node 156, an output of the node 156 is subtracted from an output of the node 154 at a node 157, thereby obtaining a filter passband with a low-frequency cutoff frequency of 6.86 KHz and a high-frequency cutoff frequency of 8.64 KHz, and this is a filter passband 11. 2-fold frequency reduction (÷2) is applied to the output of the node 135 at a node 165, 2-fold frequency raising (×2) is applied to an output of the node 165 to obtain a PCM stream of 24 kfs at a node 166, a node 164 is a delay circuit and applies a delay to the output of the node 156 to cause the output delay of the node 164 to be equal to that of the node 166, an output of the node 166 is subtracted from an output of the node 164 at a node 167, thereby obtaining a filter passband with a low-frequency cutoff frequency of 5.44 KHz and a high-frequency cutoff frequency of 6.86 KHz, and this is a filter passband 12.

In addition, 2-fold frequency reduction (÷2) is applied to the output of the node 143 at a node 173, and 2-fold frequency reduction (÷2) is applied to the output of the node 153 at a node 175.

Figures 2, 3, 4:
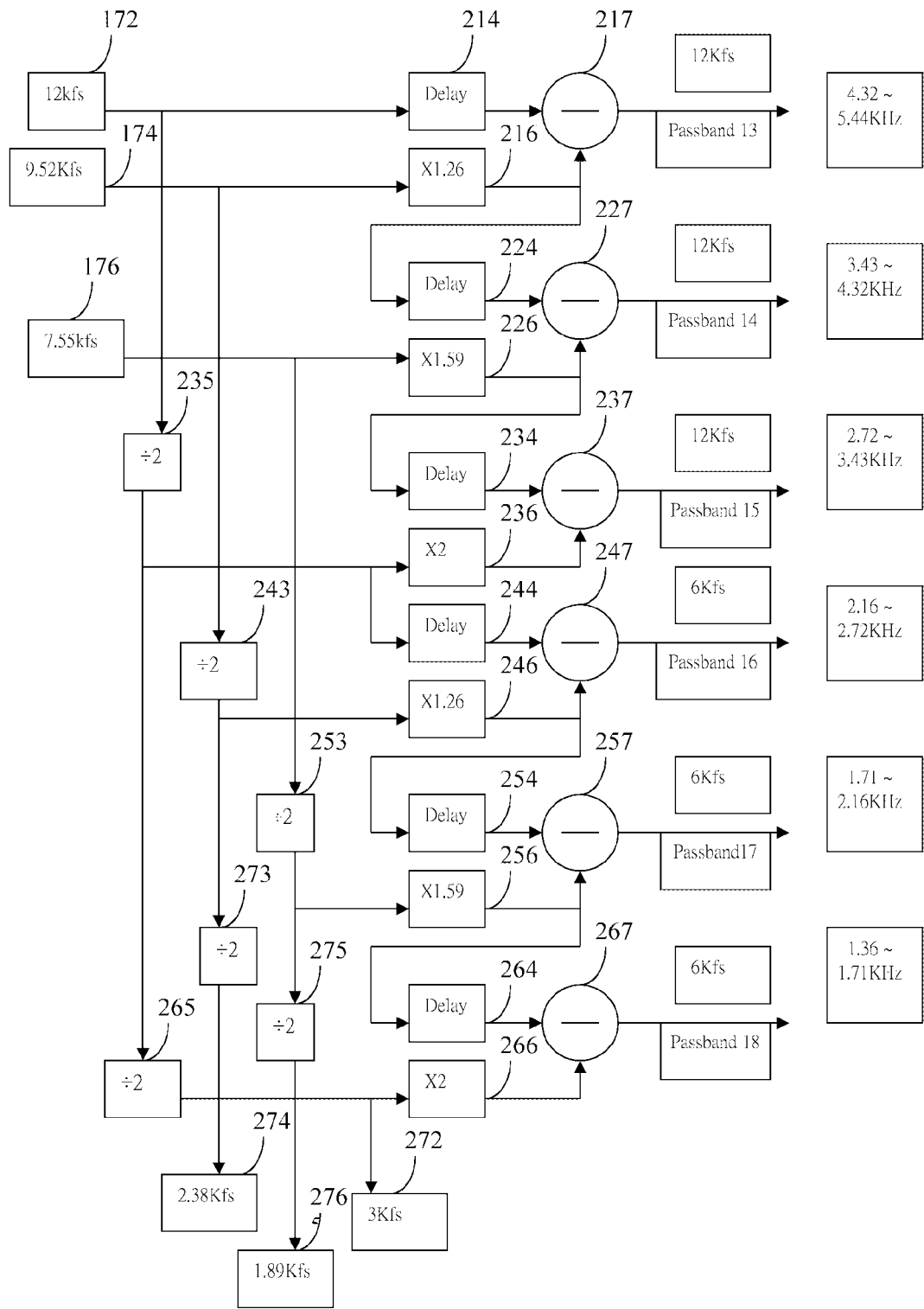
Figures 2, 3, 4, 5:
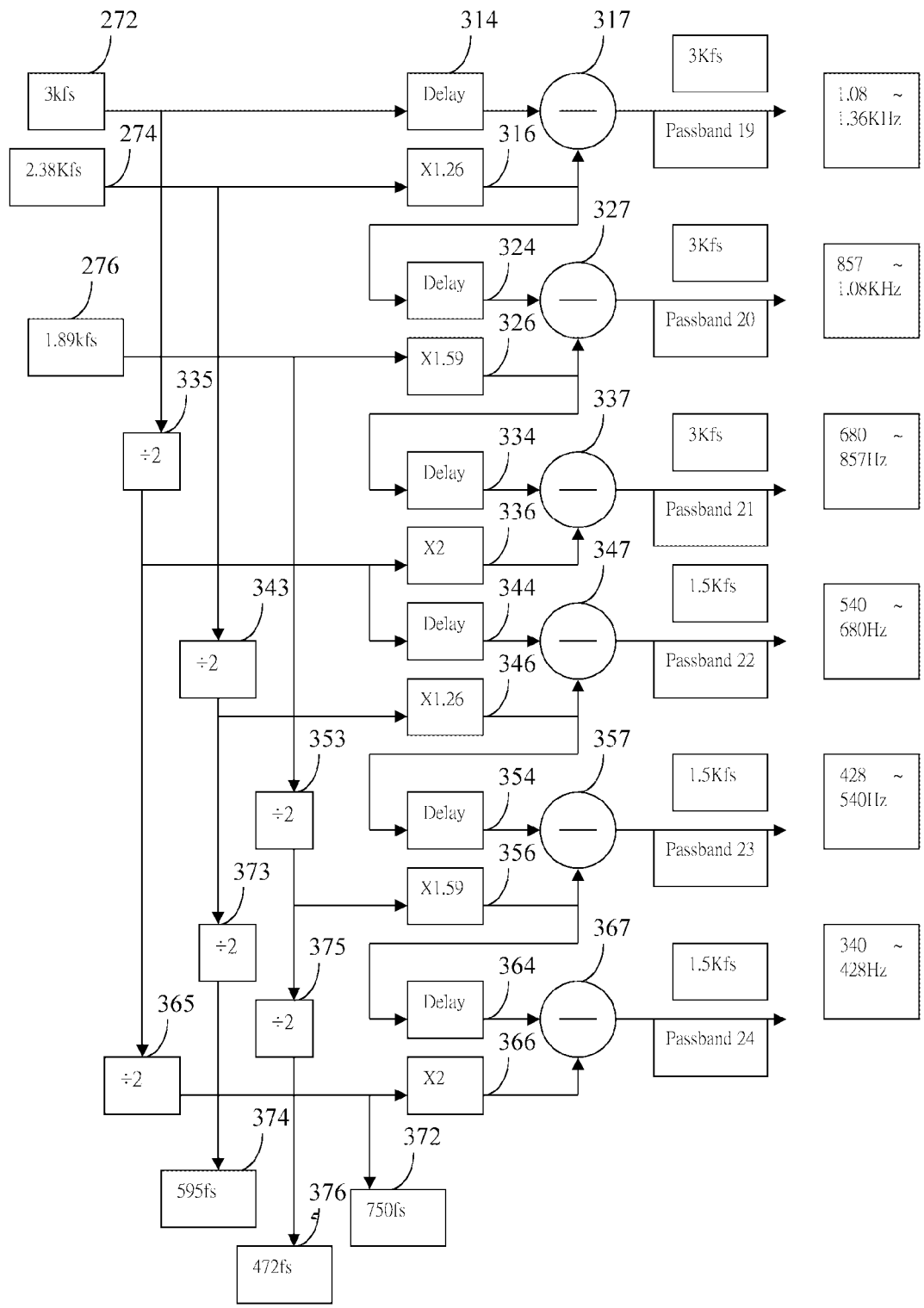
Figures 2, 3, 4, 5, 6:
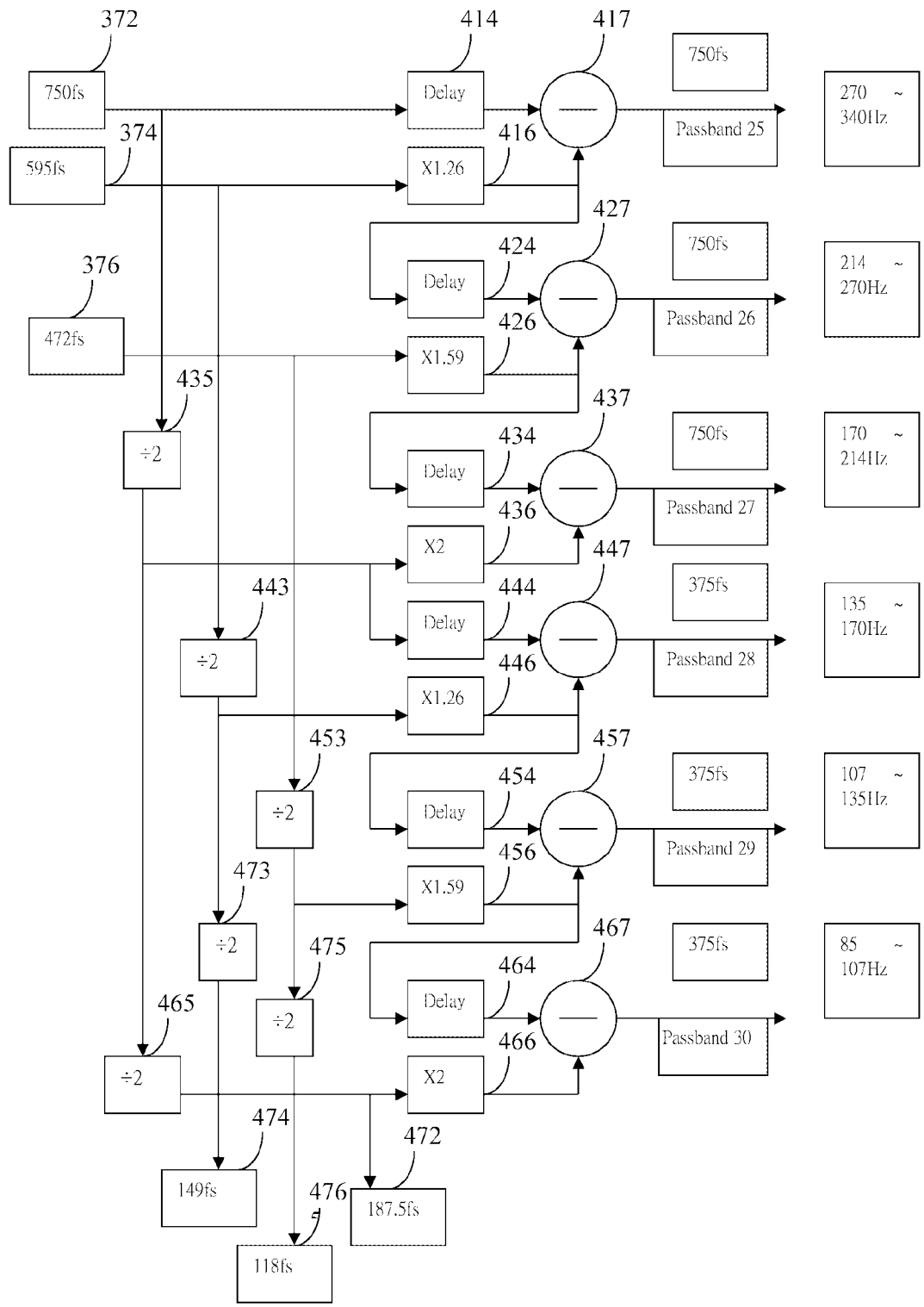
Figures 2, 3, 4, 5, 6, 7:
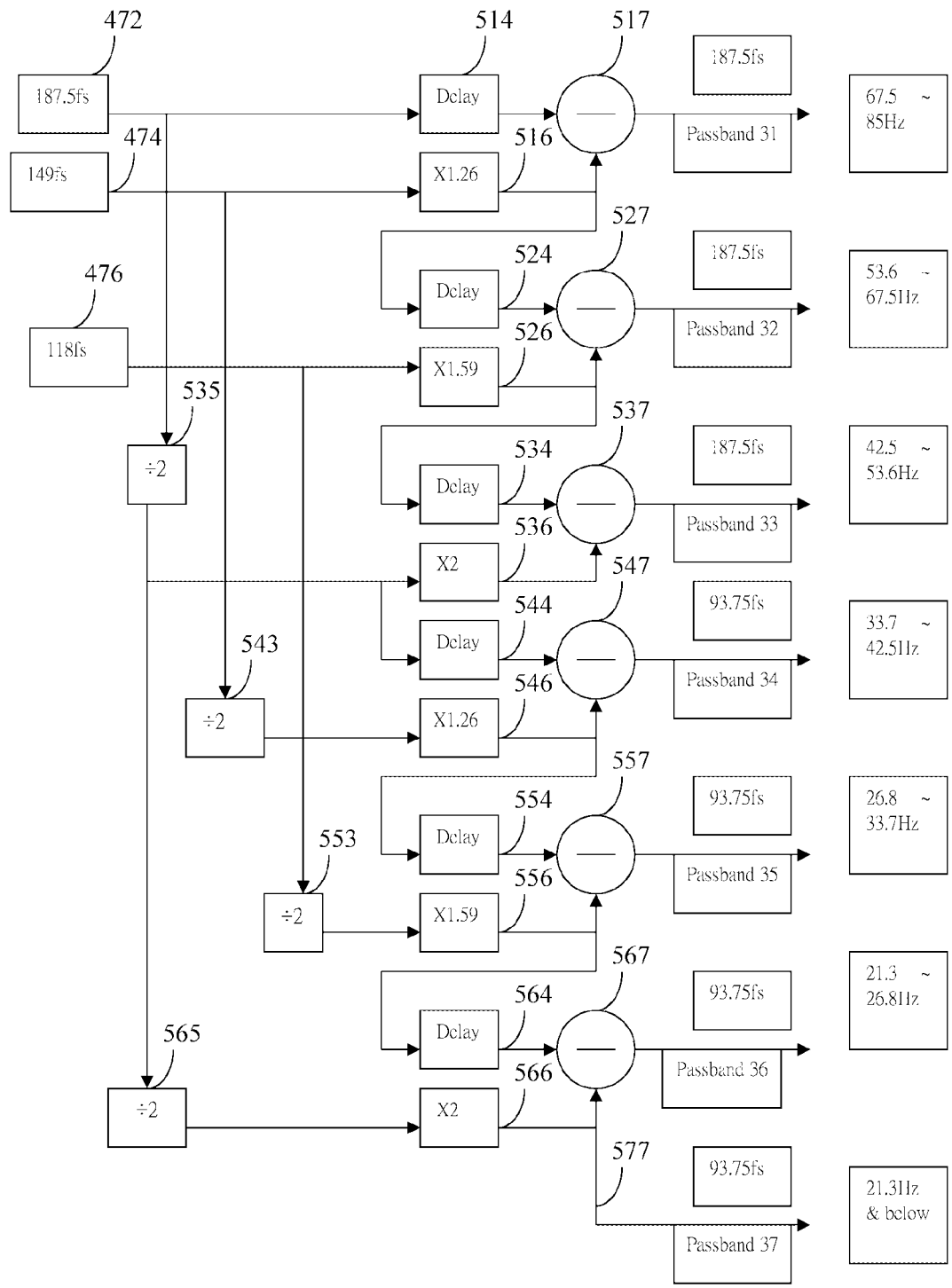
Figures 2, 3, 4, 5, 6, 7, 8:
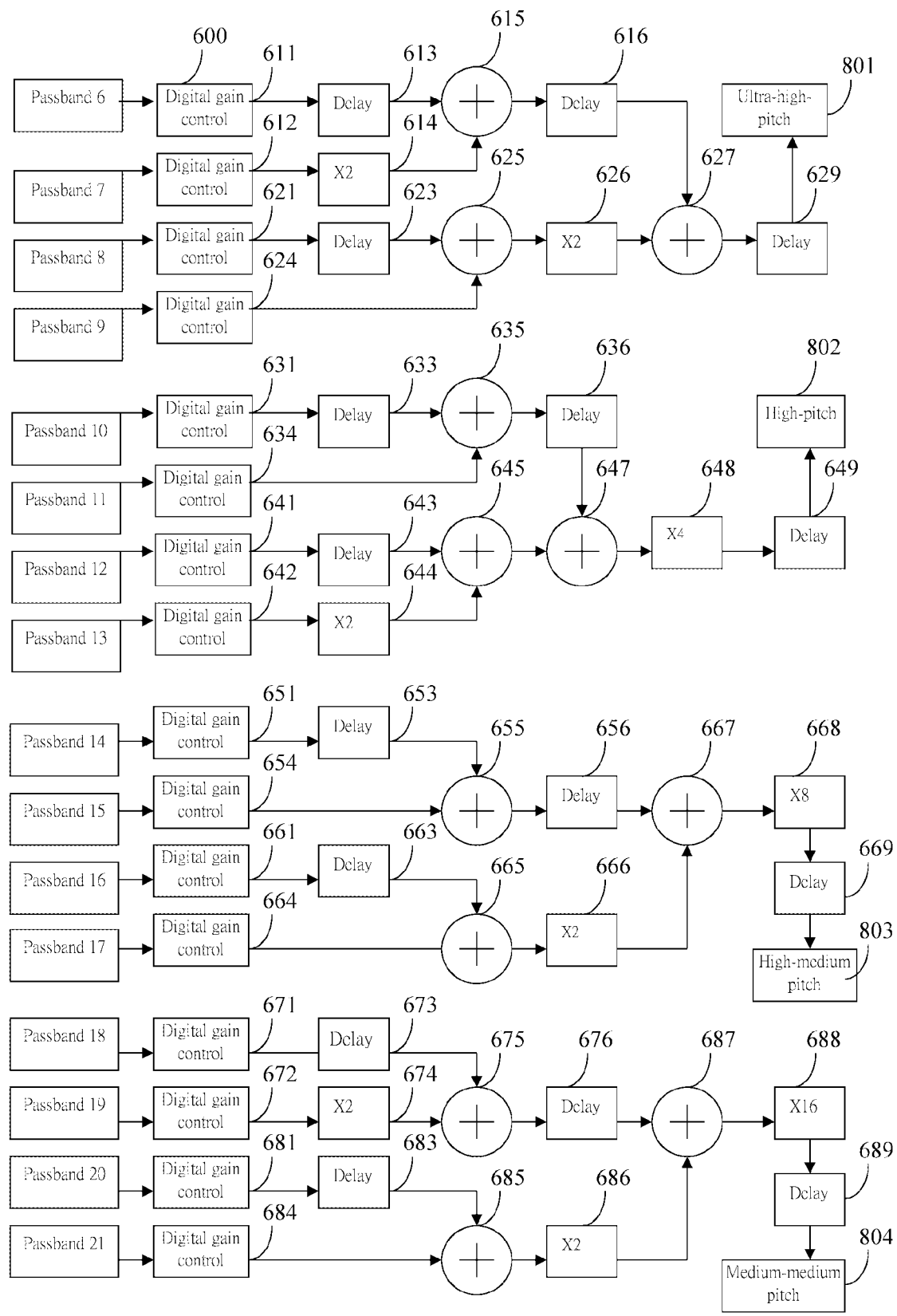
Figures 2, 3, 4, 5, 6, 7, 8, 9:
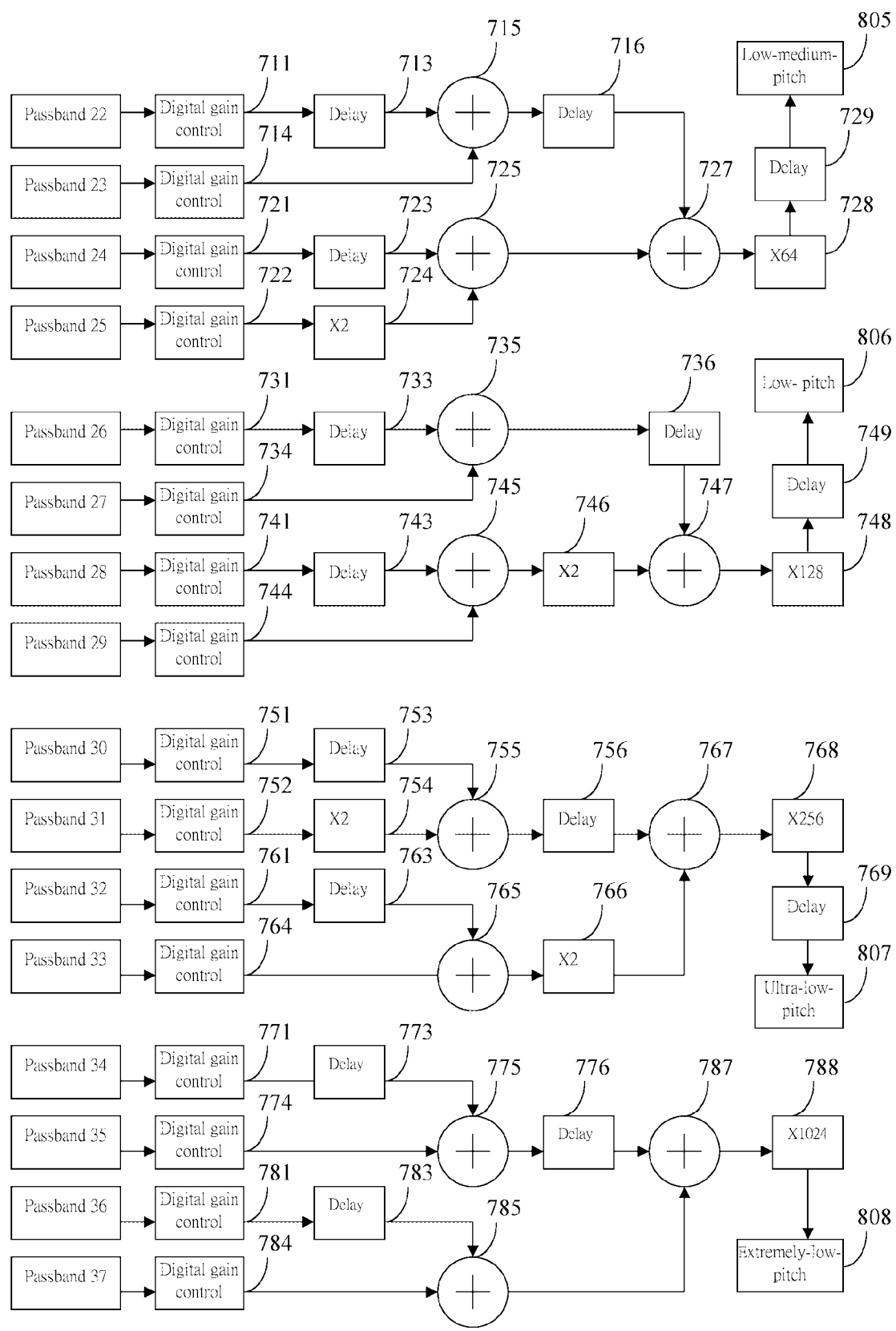
Figures 2, 3, 4, 5, 6, 7, 8, 9, 10:
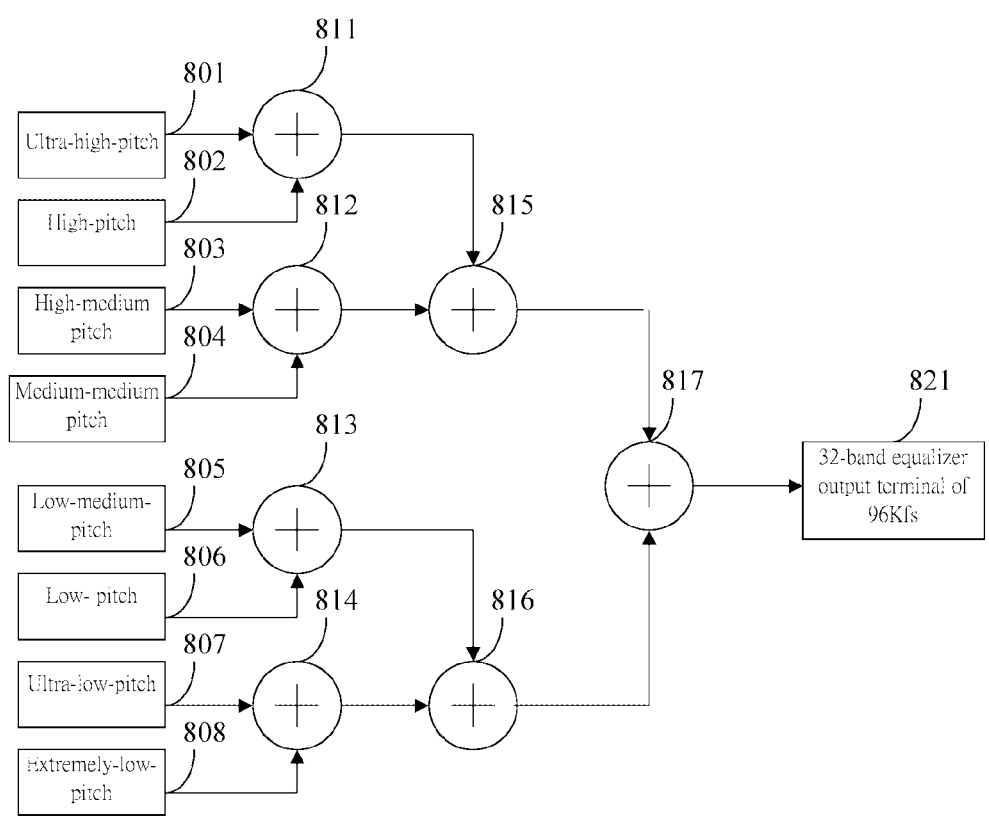

In addition, FIG. 2-4 is a continuous drawing of FIG. 2-3. As shown in FIG. 2-4, 1.26-fold frequency raising (×1.26) is applied to an output of a node 174 to obtain a PCM stream of 12 kfs at a node 216, a node 214 is a delay circuit and applies a delay to an output of a node 172 to cause the output delay of the node 214 to be equal to that of the node 216, an output of the node 216 is subtracted from an output of the node 214 at a node 217, thereby obtaining a filter passband with a low-frequency cutoff frequency of 4.32 KHz and a high-frequency cutoff frequency of 5.44 KHz, and this is a filter passband 13. 1.59-fold frequency raising (×1.59) is applied to an output of a node 176 to obtain a PCM stream of 12 kfs at a node 226, a node 224 is a delay circuit and applies a delay to the output of the node 216 to cause the output delay of the node 224 to be equal to that of the node 226, an output of the node 226 is subtracted from an output of the node 224 at a node 227, thereby obtaining a filter passband with a low-frequency cutoff frequency of 3.43 KHz and a high-frequency cutoff frequency of 4.32 KHz, and this is a filter passband 14. 2-fold frequency reduction (÷2) is applied to the output of the node 172 at a node 235, 2-fold frequency raising (×2) is applied to an output of the node 235 to obtain a PCM stream of 12 kfs at a node 236, a node 234 is a delay circuit and applies a delay to the output of the node 226 to cause the output delay of the node 234 to be equal to that of the node 236, an output of the node 236 is subtracted from an output of the node 234 at a node 237, thereby obtaining a filter passband with a low-frequency cutoff frequency of 2.72 KHz and a high-frequency cutoff frequency of 3.43 KHz, and this is a filter passband 15. 2-fold frequency reduction (÷2) is applied to the output of the node 174 at a node 243, 1.26-fold frequency raising (×1.26) is applied to an output of the node 243 to obtain a PCM stream of 6 kfs at a node 246, a node 244 is a delay circuit and applies a delay to the output of the node 235 to cause the output delay of the node 244 to be equal to that of the node 246, an output of the node 246 is subtracted from an output of the node 244 at a node 247, thereby obtaining a filter passband with a low-frequency cutoff frequency of 2.16 KHz and a high-frequency cutoff frequency of 2.72 KHz, and this is a filter passband 16. 2-fold frequency reduction (÷2) is applied to the output of the node 176 at a node 253, 1.59-fold frequency raising (×1.59) is applied to an output of the node 253 to obtain a PCM stream of 6 kfs at a node 256, a node 254 is a delay circuit and applies a delay to the output of the node 246 to cause the output delay of the node 254 to be equal to that of the node 256, an output of the node 256 is subtracted from an output of the node 254 at a node 257, thereby obtaining a filter passband with a low-frequency cutoff frequency of 1.71 KHz and a high-frequency cutoff frequency of 2.16 KHz, and this is a filter passband 17. 2-fold frequency reduction (÷2) is applied to the output of the node 235 at a node 265, 2-fold frequency raising (×2) is applied to an output of the node 265 to obtain a PCM stream of 6 kfs at a node 266, a node 264 is a delay circuit and applies a delay to the output of the node 256 to cause the output delay of the node 264 to be equal to that of the node 266, an output of the node 266 is subtracted from an output of the node 264 at a node 267, thereby obtaining a filter passband with a low-frequency cutoff frequency of 1.36 KHz and a high-frequency cutoff frequency of 1.71 KHz, and this is a filter passband 18.

In addition, 2-fold frequency reduction (÷2) is applied to the output of the node 243 at a node 273, and 2-fold frequency reduction (÷2) is applied to the output of the node 253 at a node 275.

In addition, FIG. 2-5 is a continuous drawing of FIG. 2-4. As shown in FIG. 2-5, 1.26-fold frequency raising (×1.26) is applied to an output of a node 274 to obtain a PCM stream of 3 kfs at a node 316, a node 314 is a delay circuit and applies a delay to an output of a node 272 to cause the output delay of the node 314 to be equal to that of the node 316, an output of the node 316 is subtracted from an output of the node 314 at a node 317, thereby obtaining a filter passband with a low-frequency cutoff frequency of 1.08 KHz and a high-frequency cutoff frequency of 1.36 KHz, and this is a filter passband 19. 1.59-fold frequency raising (×1.59) is applied to an output of a node 276 to obtain a PCM stream of 3 kfs at a node 326, a node 324 is a delay circuit and applies a delay to the output of the node 316 to cause the output delay of the node 324 to be equal to that of the node 326, an output of the node 326 is subtracted from an output of the node 324 at a node 327, thereby obtaining a filter passband with a low-frequency cutoff frequency of 857 Hz and a high-frequency cutoff frequency of 1.08 KHz, and this is a filter passband 20. 2-fold frequency reduction (÷2) is applied to the output of the node 272 at a node 335, 2-fold frequency raising (×2) is applied to an output of the node 335 to obtain a PCM stream of 3 kfs at a node 336, a node 334 is a delay circuit and applies a delay to the output of the node 326 to cause the output delay of the node 334 to be equal to that of the node 336, an output of the node 336 is subtracted from an output of the node 334 at a node 337, thereby obtaining a filter passband with a low-frequency cutoff frequency of 680 Hz and a high-frequency cutoff frequency of 857 Hz, and this is a filter passband 21. 2-fold frequency reduction (÷2) is applied to the output of the node 274 at a node 343, 1.26-fold frequency raising (×1.26) is applied to an output of the node 343 to obtain a PCM stream of 1.5 kfs at a node 346, a node 344 is a delay circuit and applies a delay to the output of the node 335 to cause the output delay of the node 344 to be equal to that of the node 346, an output of the node 346 is subtracted from an output of the node 344 at a node 347, thereby obtaining a filter passband with a low-frequency cutoff frequency of 540 Hz and a high-frequency cutoff frequency of 680 Hz, and this is a filter passband 22. 2-fold frequency reduction (÷2) is applied to the output of the node 276 at a node 353, 1.59-fold frequency raising (×1.59) is applied to an output of the node 353 to obtain a PCM stream of 1.5 kfs at a node 356, a node 354 is a delay circuit and applies a delay to the output of the node 346 to cause the output delay of the node 354 to be equal to that of the node 356, an output of the node 356 is subtracted from an output of the node 354 at a node 357, thereby obtaining a filter passband with a low-frequency cutoff frequency of 428 Hz and a high-frequency cutoff frequency of 540 Hz, and this is a filter passband 23. 2-fold frequency reduction (÷2) is applied to the output of the node 335 at a node 365, 2-fold frequency raising (×2) is applied to an output of the node 365 to obtain a PCM stream of 1.5 kfs at a node 366, a node 364 is a delay circuit and applies a delay to the output of the node 356 to cause the output delay of the node 364 to be equal to that of the node 366, an output of the node 366 is subtracted from an output of the node 364 at a node 367, thereby obtaining a filter passband with a low-frequency cutoff frequency of 340 Hz and a high-frequency cutoff frequency of 428 Hz, and this is a filter passband 24.

In addition, 2-fold frequency reduction (÷2) is applied to the output of the node 343 at a node 373, and 2-fold frequency reduction (÷2) is applied to the output of the node 353 at a node 375.

In addition, FIG. 2-6 is a continuous drawing of FIG. 2-5. As shown in FIG. 2-6, 1.26-fold frequency raising (×1.26) is applied to an output of a node 374 to obtain a PCM stream of 750 fs at a node 416, a node 414 is a delay circuit and applies a delay to an output of a node 372 to cause the output delay of the node 414 to be equal to that of the node 416, an output of the node 416 is subtracted from an output of the node 414 at a node 417, thereby obtaining a filter passband with a low-frequency cutoff frequency of 270 Hz and a high-frequency cutoff frequency of 340 Hz, and this is a filter passband 25. 1.59-fold frequency raising (×1.59) is applied to an output of a node 376 to obtain a PCM stream of 750 fs at a node 426, a node 424 is a delay circuit and applies a delay to the output of the node 416 to cause the output delay of the node 424 to be equal to that of the node 426, an output of the node 426 is subtracted from an output of the node 424 at a node 427, thereby obtaining a filter passband with a low-frequency cutoff frequency of 214 Hz and a high-frequency cutoff frequency of 270 Hz, and this is a filter passband 26. 2-fold frequency reduction (÷2) is applied to the output of the node 372 at a node 435, 2-fold frequency raising (×2) is applied to an output of the node 435 to obtain a PCM stream of 750 fs at a node 436, a node 434 is a delay circuit and applies a delay to the output of the node 426 to cause the output delay of the node 434 to be equal to that of the node 436, an output of the node 436 is subtracted from an output of the node 434 at a node 437, thereby obtaining a filter passband with a low-frequency cutoff frequency of 170 Hz and a high-frequency cutoff frequency of 214 Hz, and this is a filter passband 27. 2-fold frequency reduction (÷2) is applied to the output of the node 374 at a node 443, 1.26-fold frequency raising (×1.26) is applied to an output of the node 443 to obtain a PCM stream of 375 fs at a node 446, a node 444 is a delay circuit and applies a delay to the output of the node 435 to cause the output delay of the node 444 to be equal to that of the node 446, an output of the node 446 is subtracted from an output of the node 444 at a node 447, thereby obtaining a filter passband with a low-frequency cutoff frequency of 135 Hz and a high-frequency cutoff frequency of 170 Hz, and this is a filter passband 28. 2-fold frequency reduction (÷2) is applied to the output of the node 376 at a node 453, 1.59-fold frequency raising (×1.59) is applied to an output of the node 453 to obtain a PCM stream of 375 fs at a node 456, a node 454 is a delay circuit and applies a delay to the output of the node 446 to cause the output delay of the node 454 to be equal to that of the node 456, an output of the node 456 is subtracted from an output of the node 454 at a node 457, thereby obtaining a filter passband with a low-frequency cutoff frequency of 107 Hz and a high-frequency cutoff frequency of 135 Hz, and this is a filter passband 29. 2-fold frequency reduction (÷2) is applied to the output of the node 435 at a node 465, 2-fold frequency raising (×2) is applied to an output of the node 465 to obtain a PCM stream of 375 fs at a node 466, a node 464 is a delay circuit and applies a delay to the output of the node 456 to cause the output delay of the node 464 to be equal to that of the node 466, an output of the node 466 is subtracted from an output of the node 464 at a node 467, thereby obtaining a filter passband with a low-frequency cutoff frequency of 85 Hz and a high-frequency cutoff frequency of 107 Hz, and this is a filter passband 30.

In addition, 2-fold frequency reduction (÷2) is applied to the output of the node 443 at a node 473, and 2-fold frequency reduction (÷2) is applied to the output of the node 453 at a node 475.

In addition, FIG. 2-7 is a continuous drawing of FIG. 2-6. As shown in FIG. 2-7, 1.26-fold frequency raising (×1.26) is applied to an output of a node 474 to obtain a PCM stream of 187.5 fs at a node 516, a node 514 is a delay circuit and applies a delay to an output of a node 472 to cause the output delay of the node 514 to be equal to that of the node 516, an output of the node 516 is subtracted from an output of the node 514 at a node 517, thereby obtaining a filter passband with a low-frequency cutoff frequency of 67.5 Hz and a high-frequency cutoff frequency of 85 Hz, and this is a filter passband 31. 1.59-fold frequency raising (×1.59) is applied to an output of a node 476 to obtain a PCM stream of 187.5 fs at a node 526, a node 524 is a delay circuit and applies a delay to the output of the node 516 to cause the output delay of the node 524 to be equal to that of the node 526, an output of the node 526 is subtracted from an output of the node 524 at a node 527, thereby obtaining a filter passband with a low-frequency cutoff frequency of 53.6 Hz and a high-frequency cutoff frequency of 67.5 Hz, and this is a filter passband 32. 2-fold frequency reduction (÷2) is applied to the output of the node 472 at a node 535, 2-fold frequency raising (×2) is applied to an output of the node 535 to obtain a PCM stream of 187.5 fs at a node 536, a node 534 is a delay circuit and applies a delay to the output of the node 526 to cause the output delay of the node 534 to be equal to that of the node 536, an output of the node 536 is subtracted from an output of the node 534 at a node 537, thereby obtaining a filter passband with a low-frequency cutoff frequency of 42.5 Hz and a high-frequency cutoff frequency of 53.6 Hz, and this is a filter passband 33. 2-fold frequency reduction (÷2) is applied to the output of the node 474 at a node 543, 1.26-fold frequency raising (×1.26) is applied to an output of the node 543 to obtain a PCM stream of 93.75 fs at a node 546, a node 544 is a delay circuit and applies a delay to the output of the node 535 to cause the output delay of the node 544 to be equal to that of the node 546, an output of the node 546 is subtracted from an output of the node 544 at a node 547, thereby obtaining a filter passband with a low-frequency cutoff frequency of 33.7 Hz and a high-frequency cutoff frequency of 42.5 Hz, and this is a filter passband 34. 2-fold frequency reduction (÷2) is applied to the output of the node 476 at a node 553, 1.59-fold frequency raising (×1.59) is applied to an output of the node 553 to obtain a PCM stream of 93.75 fs at a node 556, a node 554 is a delay circuit and applies a delay to the output of the node 546 to cause the output delay of the node 554 to be equal to that of the node 556, an output of the node 556 is subtracted from an output of the node 554 at a node 557, thereby obtaining a filter passband with a low-frequency cutoff frequency of 26.8 Hz and a high-frequency cutoff frequency of 33.7 Hz, and this is a filter passband 35. 2-fold frequency reduction (÷2) is applied to the output of the node 535 at a node 565, 2-fold frequency raising (×2) is applied to an output of the node 565 to obtain a PCM stream of 93.75 fs at a node 566, a node 564 is a delay circuit and applies a delay to the output of the node 556 to cause the output delay of the node 564 to be equal to that of the node 566, an output of the node 566 is subtracted from an output of the node 564 at a node 567, thereby obtaining a filter passband with a low-frequency cutoff frequency of 21.3 Hz and a high-frequency cutoff frequency of 26.8 Hz, and this is a filter passband 36.

In addition, as shown in FIG. 2-7, an output of a node 577 (i.e., the node 566) is a low-pass filter passband with a high-frequency cutoff frequency of 21.3 Hz, and this is a filter passband 37.

In the above illustrated examples, what are shown are situations in which two input points are inserted between a stream with a sampling rate of 192 kfs and a stream of 96 kfs, between streams of 96 kfs and 48 kfs, between streams of 48 kfs and 24 kfs, . . . , between streams of 93.75 fs and 46.875 fs, respectively. However, this is not limited, more input points may be inserted to enable finer tuning, and at this point, the number of filter passbands is greater than 37.

In addition, FIG. 2-8 is a continuous drawing of FIG. 2-7, namely, a first part of an 8-way frequency dividing circuit with fine tuning. As shown in FIG. 2-8, a node 600 is a digital gain control circuit, and in particular, corresponding to the passbands 6~37, there are respectively arranged digital gain control circuits 611, 612, 621, 624, 631, 634, 641, 642, 651, 654, 661, 664, 671, 672, 681, 684, 711, 714, 721, 722, 731, 734, 741, 744, 751, 752, 761, 764, 771, 774, 781 and 784 (as shown in FIG. 2-8 and FIG. 2-9). A node 614 applies 2-fold frequency raising (×2) to an output of the node 612, a node 613 is a delay circuit and applies a delay to the node 611 to cause the output delay of the node 613 to be equal to that of the node 614, and an output of the node 614 and an output of the node 613 are added at a node 615. A node 623 is a delay circuit and applies a delay to the node 621 to cause the output delay of the node 623 to be equal to that of the node 624, and an output of the node 624 and an output of the node 623 are added at a node 625. A node 626 applies 2-fold frequency raising (×2) to an output of the node 625, a node 616 is a delay circuit and applies a delay to the node 615 to cause the output delay of the node 616 to be equal to that of the node 626, and an output of the node 626 and an output of the node 616 are added at a node 627. A node 629 is a delay circuit and applies a delay to the node 627 to cause the output delay of the node 629 to be equal to that of the node 788. A node 801 is an ultra-high-pitch output terminal of the 8-way frequency dividing circuit.

A node 633 is a delay circuit and applies a delay to the node 631 to cause the output delay of the node 633 to be equal to that of the node 634, and an output of the node 634 and an output of the node 633 are added at a node 635. A node 644 applies 2-fold frequency raising (×2) to an output of the node 642, a node 643 is a delay circuit and applies a delay to the node 641 to cause the output delay of the node 643 to be equal to that of the node 644, and an output of the node 644 and an output of the node 643 are added at a node 645. A node 636 is a delay circuit and applies a delay to the node 635 to cause the output delay of the node 636 to be equal to that of the node 645, and an output of the node 645 and an output of the node 636 are added at a node 647. 4-fold frequency raising (×4) is applied to an output of the node 647 at a node 648, to cause the sampling rate of an output of the node 648 to be the same as that of the node 627. A node 649 is a delay circuit to cause the output delay of the node 649 to be equal to that of the node 788. A node 802 is a high-pitch output terminal of the 8-way frequency dividing circuit.

A node 653 is a delay circuit and applies a delay to the node 651 to cause the output delay of the node 653 to be equal to that of the node 654, and an output of the node 654 and an output of the node 653 are added at a node 655. A node 663 is a delay circuit and applies a delay to the node 661 to cause the output delay of the node 663 to be equal to that of the node 664, and an output of the node 664 and an output of the node 663 are added at a node 665. A node 666 applies 2-fold frequency raising (×2) to an output of the node 665, a node 656 is a delay circuit and applies a delay to the node 655 to cause the output delay of the node 656 to be equal to that of the node 666, and an output of the node 666 and an output of the node 656 are added at a node 667. 8-fold frequency raising (×8) is applied to an output of the node 667 at a node 668, to cause the sampling rate of an output of the node 668 to be the same as that of the node 627. A node 669 is a delay circuit to cause the output delay of the node 669 to be equal to that of the node 788. A node 803 is a high-medium-pitch output terminal of the 8-way frequency dividing circuit.

A node 674 applies 2-fold frequency raising (×2) to an output of the node 672, a node 673 is a delay circuit and applies a delay to the node 671 to cause the output delay of the node 673 to be equal to that of the node 674, and an output of the node 674 and an output of the node 673 are added at a node 675. A node 683 is a delay circuit and applies a delay to the node 681 to cause the output delay of the node 683 to be equal to that of the node 684, and an output of the node 684 and an output of the node 683 are added at a node 685. A node 686 applies 2-fold frequency raising (×2) to an output of the node 685, a node 676 is a delay circuit and applies a delay to the node 675 to cause the output delay of the node 676 to be equal to that of the node 686, and an output of the node 686 and an output of the node 676 are added at a node 687. 16-fold frequency raising (×16) is applied to an output of the node 687 at a node 688, to cause the sampling rate of an output of the node 688 to be the same as that of the node 627. A node 689 is a delay circuit and applies a delay to an output of the node 688 to cause the output delay of the node 689 to be equal to that of the node 788. A node 804 is a medium-medium-pitch output terminal of the 8-way frequency dividing circuit.

A node 713 is a delay circuit and applies a delay to the node 711 to cause the output delay of the node 713 to be equal to that of the node 714, and an output of the node 714 and an output of the node 713 are added at a node 715. A node 724 applies 2-fold frequency raising (×2) to an output of the node 722, a node 723 is a delay circuit and applies a delay to the node 721 to cause the output delay of the node 723 to be equal to that of the node 724, and an output of the node 724 and an output of the node 723 are added at a node 725. A node 716 is a delay circuit and applies a delay to the node 715 to cause the output delay of the node 716 to be equal to that of the node 725, and an output of the node 716 and an output of the node 725 are added at a node 727. 64-fold frequency raising (×64) is applied to an output of the node 727 at a node 728, to cause the sampling rate of an output of the node 728 to be the same as that of the node 627. A node 729 is a delay circuit to cause the output delay of the node 729 to be equal to that of the node 788. A node 805 is a low-medium-pitch output terminal of the 8-way frequency dividing circuit.

A node 733 is a delay circuit and applies a delay to the node 731 to cause the output delay of the node 733 to be equal to that of the node 734, and an output of the node 734 and an output of the node 733 are added at a node 735. A node 743 is a delay circuit and applies a delay to the node 741 to cause the output delay of the node 743 to be equal to that of the node 744, and an output of the node 744 and an output of the node 743 are added at a node 745. A node 746 applies 2-fold frequency raising (×2) to an output of the node 745, a node 736 is a delay circuit and applies a delay to the node 735 to cause the output delay of the node 736 to be equal to that of the node 746, and an output of the node 746 and an output of the node 736 are added at a node 747. 128-fold frequency raising (×128) is applied to an output of the node 747 at a node 748, to cause the sampling rate of an output of the node 748 to be the same as that of the node 627. A node 749 is a delay circuit to cause the output delay of the node 749 to be equal to that of the node 788. A node 806 is a low-pitch output terminal of the 8-way frequency dividing circuit.

A node 754 applies 2-fold frequency raising (×2) to an output of the node 752, a node 753 is a delay circuit and applies a delay to the node 751 to cause the output delay of the node 753 to be equal to that of the node 754, and an output of the node 754 and an output of the node 753 are added at a node 755. A node 763 is a delay circuit and applies a delay to the node 761 to cause the output delay of the node 763 to be equal to that of the node 764, and an output of the node 764 and an output of the node 763 are added at a node 765. A node 766 applies 2-fold frequency raising (×2) to an output of the node 765, a node 756 is a delay circuit and applies a delay to the node 755 to cause the output delay of the node 756 to be equal to that of the node 766, and an output of the node 766 and an output of the node 756 are added at a node 767. 256-fold frequency raising (×256) is applied to an output of the node 767 at a node 768, to cause the sampling rate of an output of the node 768 to be the same as that of the node 627. A node 769 is a delay circuit and applies a delay to an output of the node 768 to cause the output delay of the node 769 to be equal to that of the node 788. A node 807 is a ultra-low-pitch output terminal of the 8-way frequency dividing circuit.

A node 773 is a delay circuit and applies a delay to the node 771 to cause the output delay of the node 773 to be equal to that of the node 774, and an output of the node 774 and an output of the node 773 are added at a node 775. A node 783 is a delay circuit and applies a delay to the node 781 to cause the output delay of the node 783 to be equal to that of the node 784, and an output of the node 784 and an output of the node 783 are added at a node 785. A node 776 is a delay circuit and applies a delay to the node 775 to cause the output delay of the node 776 to be equal to that of the node 785, and an output of the node 785 and an output of the node 776 are added at a node 787. 1024-fold frequency raising (×1024) is applied to an output of the node 787 at a node 788, to cause the sampling rate of an output of the node 788 to be the same as that of the node 627. A node 808 is an extremely-low-pitch output terminal of the 8-way frequency dividing circuit.

From FIG. 2-8 and FIG. 2-9, it can be seen that each way of the 8-way crossover obtained as described above may utilize a gain control circuit for tuning, for example, the gain of any of the passbands 6~9 corresponding to the ultra-high-pitch output terminal 801 may be adjusted, and the same is true for other output terminals 802~808.

In addition, as described above, if 3 or more input points are inserted between the node 2 and the node 35, between the node 35 and the node 65, . . . , between the node 535 and the node 565, then filter passbands more than those in the example may be obtained, and thereby finer tuning may be performed.

In addition, FIG. 2-10 is a continuous drawing of FIG. 2-9, namely, is a 32-band equalizer output. As shown in FIG. 2-10, an output of the node 802 and an output of the node 801 are added at a node 811, an output of the node 804 and an output of the node 803 are added at a node 812, an output of the node 806 and an output of the node 805 are added at a node 813, an output of the node 808 and an output of the node 807 are added at a node 814, an output of the node 812 and an output of the node 811 are added at a node 815, an output of the node 814 and an output of the node 813 are added at a node 816, an output of the node 816 and an output of the node 815 are added at a node 817, and a node 821 (i.e., an output of the node 817) is the 32-band equalizer output terminal. In addition, likewise, if, as described above, 3 or more input points are inserted between the node 2 and the node 35, between the node 35 and the node 65, . . . , between the node 535 and the node 565, then an equalizer of more than 32 bands may be constructed.

In the embodiments as described above, at a node such as the nodes 17, 27, etc. and the nodes 615, 625, etc. at which subtraction or addition is performed, for example, a binary adder may be utilized, but this is not limited, and it may also be other type of circuit, as long as it can achieve the above functions. In addition, there is no specific limitation with respect to the delay circuits, the frequency raising circuits and the frequency reduction circuits involved in this application, as long as they can achieve the above functions.

From the above, in the invention of this application, by downsampling a PCM stream fs0 to a preset sampling rate 2fs1, then raising the sampling rate of 2fs1 to be the same as that of the original PCM stream fs0, and inserting a delay circuit for the original PCM stream fs0 to cause it to be delayed, such that the phase of fs0 is consistent with that of 2fs1, and then utilizing for example a binary adder for operation, that is, removing low frequency by the operation of fs0-2fs1, a new PCM stream fs01 is obtained, which is the passband 1; in turn, the above processing procedure is repeated for the 2fs1 to obtain 2fs2 and another new PCM stream fs12, which is the passband 2; likewise, the above processing procedure is repeated for 2fs2 to obtain 2fs3 and another new PCM stream fs23, which is the passband 3, and so on, until 2fsn and a last new PCM stream fs(n−1)n (i.e., 2fs(n−1)−2fsn) are obtained, which stream is the passband n, and 2fsn is the passband n+1.

In turn, to construct a many-way crossover, the individual passbands are upsampled such that their sampling rates are the same as that of the original PCM stream fs0, and delay circuits are utilized to cause the phases of the individual passbands to be consistent, thus constructing the many-way crossover (e.g., FIGS. 2-8, 2-9).

In addition, it may further be possible to group and add adjacent passbands, thereby constructing a few-way crossover. In addition, if gain control and addition is performed on all the passbands, an equalizer may be constructed (for example, FIGS. 2-8, 2-9, 2-10).

From the above, with the invention, it may be possible to construct a sound device which needs a digital passband filter, such as a PCM digital equalizer, a digital crossover and a digital speaker management system, etc.

Nowadays, no digital equalizer is supplied on the market, whereas the digital crossover is at most 4-way. However, the invention may provide a crossover of 32 ways or even more ways.

In the above, embodiments are listed to describe the invention, however, the invention is not limited thereto, and various changes may be made within a range which does not depart from the aim of the invention.

The invention claimed is:

1. A pulse code modulation passband filter, comprising a 1st to an n-th delay circuits, a 1st to an n-th frequency reduction circuits, a 1st to an n-th frequency raising circuits and a 1st to an n-th adders, n being an integer greater than or equal to 1, wherein:
the 1st frequency reduction circuit downsamples a sampling rate of a pulse code modulation stream from a pulse code modulation signal source to a predetermined sampling rate and thereby obtains a 1st pulse code modulation stream, the 1st frequency raising circuit raises the sampling rate of the 1st pulse code modulation stream to be the same as that of the pulse code modulation stream from the pulse code modulation signal source, the 1st delay circuit delays the pulse code modulation stream from the pulse code modulation signal source, such that its phase is the same as that of the 1st pulse code modulation stream after the delay, the 1st adder subtracts an output of the 1st frequency raising circuit from the delayed pulse code modulation stream from the pulse code modulation signal source to obtain a 1st passband, the j-th frequency reduction circuit downsamples the sampling rate of a pulse code modulation stream from a (j−1)-th frequency reduction circuit to a predetermined sampling rate and thereby obtains a j-th pulse code modulation stream, wherein 2≤j≤n, the j-th frequency raising circuit raises the sampling rate of the j-th pulse code modulation stream to be the same as that of the pulse code modulation stream from the (j−1)-th frequency reduction circuit, the j-th delay circuit delays the pulse code modulation stream from the (j−1)-th frequency reduction circuit, such that its phase is the same as that of the j-th pulse code modulation stream after the delay, the j-th adder subtracts an output of the j-th frequency raising circuit from the delayed pulse code modulation stream of the (j−1)-th frequency reduction circuit to obtain a j-th passband, and when j=n, the output of the j-th frequency raising circuit is a (n+1)-th passband.

2. The pulse code modulation passband filter as claimed in claim 1, further comprising a 1st to an n-th passband frequency raising circuits arranged corresponding to the 2nd to the (n+1)-th passbands, respectively, which upsample the 2nd to the (n+1)-th passbands to be the same as the sampling rate of the pulse code modulation stream of the pulse code modulation signal source, respectively.

3. The pulse code modulation passband filter as claimed in claim 2, further comprising a 1st to an n-th passband delay circuits arranged corresponding to the 1st to the n-th passbands, respectively, wherein the 1st to the n-th passband delay circuits are utilized to cause the phases of the 1st to the (n+1)-th passbands to be consistent.

4. The pulse code modulation passband filter as claimed in claim 3, further comprising m passband adding circuits which group and add adjacent passbands of the 1st to the (n+1)-th passbands, wherein 1<m<n+1.

5. The pulse code modulation passband filter as claimed in claim 3, further comprising: a 1st to a (n+1)-th digital gain control circuits arranged corresponding to the 1st to the (n+1)-th passbands, respectively; and a circuit which adds the outputs of the 1st to a (n+1)-th digital gain control circuits.

6. A method for obtaining multiple filter passbands, comprising:
downsampling a sampling rate of a pulse code modulation stream from a pulse code modulation signal source to a predetermined sampling rate and thereby obtaining a 1st pulse code modulation stream;

raising the sampling rate of the 1st pulse code modulation stream to be the same as that of the pulse code modulation stream from the pulse code modulation signal source;

delaying the pulse code modulation stream from the pulse code modulation signal source, such that its phase is the same as that of the 1st pulse code modulation stream after the delay;

subtracting the frequency raised 1st pulse code modulation stream from the delayed pulse code modulation stream from the pulse code modulation signal source to obtain a 1st passband;

downsampling the sampling rate of a (j−1)-th pulse code modulation stream to a predetermined sampling rate and thereby obtaining a j-th pulse code modulation stream, wherein 2≤j≤n, and n is a number of times that the pulse code modulation signal source is frequency reduced;

raising the sampling rate of the j-th pulse code modulation stream to be the same as that of the (j−1)-th pulse code modulation stream;

delaying the (j−1)-th pulse code modulation stream, such that its phase is the same as that of the j-th pulse code modulation stream after the delay; and subtracting the frequency raised j-th pulse code modulation stream from the delayed (j−1)-th pulse code modulation stream to obtain a j-th passband, wherein when j=n, the j-th pulse code modulation stream is a (n+1)-th passband.

7. A pulse code modulation passband filter, comprising:
an audio pulse code modulation signal source outputting an audio pulse code modulation stream;

a frequency raising & reduction circuit performing frequency raising or reduction on a sampling rate of the audio pulse code modulation stream from the audio pulse code modulation signal source and converting it into a preset sampling rate, namely, a working sampling rate;

a main clock generation circuit extracting from the audio pulse code modulation signal source a main clock which is synchronized with the audio pulse code modulation signal source and corresponds to an output of the frequency raising & reduction circuit;

a 1st to an n-th frequency dividers performing frequency reduction by greater than 1 and less than 2 times on the main clock respectively to obtain a 1st to an n-th clocks which are different; and a 1st to an n-th secondary signal sources performing frequency reduction on the working sampling rate of a stream outputted from the frequency raising & reduction circuit according to the 1st to the n-th clocks respectively and outputting a 1st to an n-th secondary streams respectively, and the stream outputted by the frequency raising & reduction circuit and the 1st to the n-th secondary streams are used as a combined input source of the pulse code modulation passband filter.

8. The pulse code modulation passband filter as claimed in claim 7, wherein the sampling rate of the audio pulse code modulation signal source is any of 32 kfs 768 kfs.

9. The pulse code modulation passband filter as claimed in claim 8, wherein the sampling rate of the stream outputted by the frequency raising & reduction circuit is 192 kfs.

10. A pulse code modulation passband filter, comprising:
a pulse code modulation signal source, a 1st to an n-th delay circuits, a 1st to an n-th frequency reduction circuits, a 1st to an n-th frequency raising circuits and a 1st to an n-th adders, n being an integer greater than or equal to 1;
a 2-fold frequency reduction circuit and a 2-fold frequency raising circuit, wherein;
the 2-fold frequency reduction circuit performs 2-fold frequency reduction on the sampling rate of a pulse code modulation stream from the pulse code modulation signal source, and the 2-fold frequency raising circuit performs 2-fold frequency raising on an output of the 2-fold frequency reduction circuit, such that the sampling rate of a stream outputted by the 2-fold frequency raising circuit is raised to be the same as that of the pulse code modulation stream from the pulse code modulation signal source,
the 1st frequency reduction circuit performs greater than 1-fold and less than 2-fold frequency reduction on the sampling rate of the pulse code modulation stream from the pulse code modulation signal source, thereby obtaining a 1st pulse code modulation stream,
the 1st frequency raising circuit raises the sampling rate of the 1st pulse code modulation stream to be the same as that of the pulse code modulation stream from the pulse code modulation signal source,
the 1st delay circuit delays the pulse code modulation stream from the pulse code modulation signal source, such that its phase is the same as that of the 1st pulse code modulation stream after the delay,
the 1st adder subtracts an output of the 1st frequency raising circuit from the delayed pulse code modulation stream from the pulse code modulation signal source to obtain a 1st passband,
the j-th frequency reduction circuit performs greater than 1-fold and less than 2-fold frequency reduction on the sampling rate of the pulse code modulation stream from the pulse code modulation signal source, thereby obtaining a j-th pulse code modulation stream, wherein 2≤j≤n,
the j-th frequency raising circuit raises the sampling rate of the j-th pulse code modulation stream to be the same as that of a (j−1)-th pulse code modulation stream,
the j-th delay circuit delays a pulse code modulation stream from the (j−1)-th frequency raising circuit, such that its phase is the same as that of the j-th pulse code modulation stream after the delay, the j-th adder subtracts an output of the j-th frequency raising circuit from the delayed pulse code modulation stream of the (j−1)-th frequency reduction circuit to obtain a j-th passband,
when j=n, a (n+1)-th delay circuit is utilized to delay a pulse code modulation stream from the n-th frequency raising circuit, such that its phase is the same as that of the stream outputted by the 2-fold frequency raising circuit after the delay, and
a (n+1)-th adder subtracts the stream outputted by the 2-fold frequency raising circuit from the delayed pulse code modulation stream of the n-th frequency raising circuit to obtain a (n+1)-th passband.

11. The pulse code modulation passband filter as claimed in claim 10, further comprising a 1st to a (n+1)-th digital gain control circuits arranged corresponding to the 1st to the (n+1)-th passbands, respectively, wherein the 1st to a (n+1)-th digital gain control circuits are configured to adjust gains of the 1st to the (n+1)-th passbands, respectively.

12. A method for obtaining multiple filter passbands, comprising:
performing greater than 1-fold and less than 2-fold frequency reduction on the sampling rate of a pulse code modulation stream from a pulse code modulation signal source, thereby obtaining a 1st pulse code modulation stream,
raising a sampling rate of the 1st pulse code modulation stream to be the same as that of the pulse code modulation stream from the pulse code modulation signal source,
delaying the pulse code modulation stream from the pulse code modulation signal source, such that its phase is the same as that of the 1st pulse code modulation stream after the delay,
subtracting the frequency raised 1st pulse code modulation stream from the delayed pulse code modulation stream from the pulse code modulation signal source to obtain a 1st passband,
performing greater than 1-fold and less than 2-fold frequency reduction on the sampling rate of the pulse code modulation stream from the pulse code modulation signal source, thereby obtaining a j-th pulse code modulation stream, wherein 2≤j≤n, and n is a number of input points inserted between the pulse code modulation signal source and an input point obtained by performing 2-fold frequency reduction on a sampling rate of the pulse code modulation signal source,
raising a sampling rate of the j-th pulse code modulation stream to be the same as that of a (j−1)-th pulse code modulation stream,
delaying the (j−1)-th pulse code modulation stream, such that its phase is the same as that of the j-th pulse code modulation stream after the delay,
subtracting the frequency raised j-th pulse code modulation stream from the delayed (j−1)-th pulse code modulation stream to obtain a j-th passband,
when j=n, delaying an n-th pulse code modulation stream, such that after the delay, its phase is the same as that of a 2-fold frequency reduced stream obtained after 2-fold frequency reduction is performed on the sampling rate of the pulse code modulation stream from the pulse code modulation signal source, and
subtracting a stream after 2-fold frequency raising is performed on the 2-fold frequency reduced stream from the delayed n-th pulse code modulation stream to obtain a (n+1)-th passband.

13. The method as claimed in claim 12, wherein gains of the 1st to the (n+1)-th passbands are adjusted respectively, and outputs of the individual passbands are added after the gain adjustment.

\* \* \* \* \*